(12) United States Patent
Kishimoto

(10) Patent No.: US 10,903,460 B2
(45) Date of Patent: Jan. 26, 2021

(54) FLEXIBLE OLED DEVICE, METHOD FOR MANUFACTURING SAME, AND SUPPORT SUBSTRATE

(71) Applicant: SAKAI DISPLAY PRODUCTS CORPORATION, Sakai (JP)

(72) Inventor: Katsuhiko Kishimoto, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/767,466

(22) PCT Filed: Mar. 20, 2018

(86) PCT No.: PCT/JP2018/011074
§ 371 (c)(1),
(2) Date: May 27, 2020

(87) PCT Pub. No.: WO2019/180823
PCT Pub. Date: Sep. 26, 2019

(65) Prior Publication Data
US 2020/0381674 A1    Dec. 3, 2020

(51) Int. Cl.
*H01L 51/56*    (2006.01)
*H01L 51/00*    (2006.01)

(52) U.S. Cl.
CPC .......... *H01L 51/56* (2013.01); *H01L 51/0097* (2013.01); *H01L 2251/5338* (2013.01)

(58) Field of Classification Search
None
See application file for complete search history.

(56) References Cited

U.S. PATENT DOCUMENTS

| 6,309,917 | B1 | 10/2001 | Furuta et al. |
| 9,093,397 | B2 | 7/2015 | Tanaka et al. |
| 2011/0073847 | A1 | 3/2011 | Kobayashi et al. |
| 2011/0204361 | A1 | 8/2011 | Nishiki et al. |
| 2015/0042913 | A1 | 2/2015 | You et al. |
| 2015/0380439 | A1 | 12/2015 | Chen et al. |
| 2016/0197293 | A1 | 7/2016 | Chen et al. |
| 2017/0170329 | A1 | 6/2017 | Su et al. |

FOREIGN PATENT DOCUMENTS

| CN | 203503661 U | 3/2014 |
| JP | H10-125929 A | 5/1998 |
| JP | 2000-323713 A | 11/2000 |
| JP | 2005-079312 A | 3/2005 |
| JP | 2011-076767 A | 4/2011 |
| JP | 2016-134307 A | 7/2016 |
| WO | 2009/037797 A1 | 3/2009 |
| WO | 2013/005254 A1 | 1/2013 |

*Primary Examiner* — Grant S Withers
(74) *Attorney, Agent, or Firm* — ScienBiziP, P.C.

(57) ABSTRACT

According to a flexible OLED device production method of the present disclosure, a multilayer stack (100) is provided, the multilayer stack including a base (10), a functional layer region (20) which includes a TFT layer and an OLED layer, a flexible film (30) provided between the base and the functional layer region and supporting the functional layer region, and a dielectric multilayer film mirror (36) provided between the flexible film and the functional layer region. The flexible film is irradiated with lift-off light (216) transmitted through the base, whereby the flexible film is delaminated from the base.

7 Claims, 14 Drawing Sheets

FLEXIBLE OLED DEVICE, METHOD FOR MANUFACTURING SAME, AND SUPPORT SUBSTRATE

TECHNICAL FIELD

The present disclosure relates to a flexible OLED device and a method for producing the same. The present invention also relates to a supporting substrate for use in the flexible OLED device production method.

BACKGROUND ART

A typical example of the flexible display includes a film which is made of a synthetic resin such as polyimide (hereinafter, referred to as "plastic film"), and elements supported by the plastic film, such as TFTs (Thin Film Transistors) and OLEDs (Organic Light Emitting Diodes). The plastic film functions as a flexible substrate. The flexible display is encapsulated with a gas barrier film (encapsulation film) because an organic semiconductor layer which is a constituent of the OLED is likely to deteriorate due to water vapor.

Production of the flexible display can be carried out using a glass base on which a plastic film is formed over the upper surface. The glass base functions as a support (carrier) for keeping the shape of the plastic film flat during the production process. Elements such as TFTs and OLEDs, a gas barrier film, and the other constituents are formed on the plastic film, whereby the structure of a flexible OLED device is realized while it is supported by the glass base. Thereafter, the flexible OLED device is delaminated from the glass base and gains flexibility. The entirety of a portion in which elements such as TFTs and OLEDs are arrayed can be referred to as "functional layer region".

Patent Document No. 1 discloses the method of irradiating the interface between a flexible substrate and a glass base with ultraviolet laser light (lift-off light) in order to delaminate from the glass base the flexible substrate with OLED devices provided thereon. According to the method disclosed in Patent Document No. 1, an amorphous silicon layer is provided between the flexible substrate and the glass base. The irradiation with the ultraviolet laser light causes generation of hydrogen from the amorphous silicon layer and causes the flexible substrate to be delaminated from the glass base.

CITATION LIST

Patent Literature

Patent Document No. 1: WO 2009/037737

SUMMARY OF INVENTION

Technical Problem

Since plastic films conventionally used in flexible substrates absorb ultraviolet light, the influence of lift-off light irradiation on TFT elements and OLED devices has not been particularly considered. According to research by the present inventor, there is a probability that ultraviolet laser light used in the delamination step will deteriorate TFT elements and OLED devices.

The present disclosure provides a flexible OLED device and a method for producing the same and a supporting substrate which are capable of solving the above-described problems.

Solution to Problem

A flexible OLED device production method of the present disclosure includes, in an exemplary embodiment, providing a multilayer stack, the multilayer stack including a base, a functional layer region which includes a TFT layer and an OLED layer, a flexible film provided between the base and the functional layer region and supporting the functional layer region, and a dielectric multilayer film mirror provided between the flexible film and the functional layer region; and irradiating the flexible film with ultraviolet laser light transmitted through the base, thereby delaminating the flexible film from the base.

In one embodiment, providing the multilayer stack includes forming the dielectric multilayer film mirror on the flexible film, forming a gas barrier film on the dielectric multilayer film mirror, forming a semiconductor layer on the gas barrier film, and irradiating the semiconductor layer with laser light which has a second wavelength, thereby reforming the semiconductor layer, the second wavelength being different from a first wavelength of the ultraviolet laser light, and a reflectance of the dielectric multilayer film mirror is relatively low at the second wavelength rather than at the first wavelength.

In one embodiment, the ultraviolet laser light which has the first wavelength enters the dielectric multilayer film mirror after passing through the base and the flexible film, and the laser light which has the second wavelength enters the dielectric layer film mirror after passing through the semiconductor layer.

In one embodiment, providing the multilayer stack includes forming the dielectric multilayer film mirror on the flexible film, including repeating formation of a high refractive index layer which has a first refractive index and formation of a low refractive index layer which has a second refractive index, the second refractive index being lower than the first refractive index.

In one embodiment, a total thickness of the high refractive index layer included in the dielectric multilayer film mirror is not less than 100 nm.

In one embodiment, a thickness of the gas barrier film is not more than 200 nm.

In one embodiment, the nigh refractive index layer is made of at least one material selected from the group consisting of $Si_3N_4$, $SiN_x$, $Al_2O_3$, $HfO_2$, $Sc_2O_3$, $Y_2O_3$, $ZrO_2$, $Ta_2O_5$, $TiO_2$ and $Nb_2O_5$, and the low refractive index layer is made of at least one material selected from the group consisting of $SiO_2$, $MgF_2$, $CaF_2$, $AlF_3$, $YF_3$, LiF and NaF.

In one embodiment, a thickness of the flexible film is not less than 5 μm and not more than 20 μm.

A flexible OLED device of the present disclosure includes, in an exemplary embodiment, a functional, layer region which includes a TFT layer and an OLED layer; a flexible film supporting the functional layer region; and a dielectric multilayer film mirror provided between the flexible film and the functional layer region.

In one embodiment, the dielectric multilayer film mirror includes three or more high refractive index layers each having a first refractive index, and two or more low refractive index layers each having a second refractive index that is lower than the first refractive index and provided between the three or more high refractive index layers.

A supporting substrate of the present disclosure is, in an exemplary embodiment, a supporting substrate of a flexible OLED device, including: a base which is made of a material capable of transmitting ultraviolet light: a flexible film supported by the base; and a dielectric multilayer film mirror supported by the flexible film.

In one embodiment, the dielectric multilayer film mirror includes three or more high refractive index layers each having a first refractive index, and two or more low refractive index layers each having a second refractive index that is lower than the first refractive index and provided between the three or more high refractive index layers.

Advantageous Effects of Invention

According to an embodiment of the present invention, a novel method for producing a flexible OLED device and a novel supporting substrate, which are capable of solving the above-described problems, are provided.

DESCRIPTION OF EMBODIMENTS

Conventionally, the flexible substrate is made of a resin material such as polyimide. Since such a resin material absorbs ultraviolet light, it has been believed that it is net necessary to consider the influence of lift-off light irradiation on TFT elements and OLED devices. However, the present inventor conducted research and found that, if the flexible substrate has a very small thickness of about 5 μm to 15 μm, the flexible substrate does not sufficiently absorb ultraviolet light in some cases, and there is a probability that ultraviolet laser light used in the delamination step will deteriorate TFT elements and OLED devices. This problem also occurred when the provided release layer is made of amorphous silicon. This is because amorphous silicon can transmit ultraviolet light. In contrast, when the release layer is made of a refractory metal, the influence of lift-off light irradiation on TFT elements and OLED devices can be averted because the refractory metal absorbs ultraviolet light or reflects ultraviolet light so as not to transmit it. However, forming a release layer with the use of a refractory metal causes a significant increase in production cost.

According to a flexible OLED device production method of the present disclosure, even if lift-off light can be transmitted through a flexible film, the effect of irradiation with the lift-off light on TFT elements and OLED elements can be reduced.

Hereinafter, an embodiment of a method and apparatus for producing a flexible OLED device of the present disclosure is described with reference to the drawings. In the following description, unnecessarily detailed description will be omitted. For example, detailed description of well-known matter and repetitive description of substantially identical elements will be omitted. This is for the purpose of avoiding the following description from being unnecessarily redundant and assisting those skilled in the art to easily understand the description. The present inventor provides the attached drawings and the following description for the purpose of assisting those skilled in the art to fully understand the present disclosure. Providing these drawings and description does not intend to limit the subject matter recited in the claims.

<Multilayer Stack>

Figure 1A:
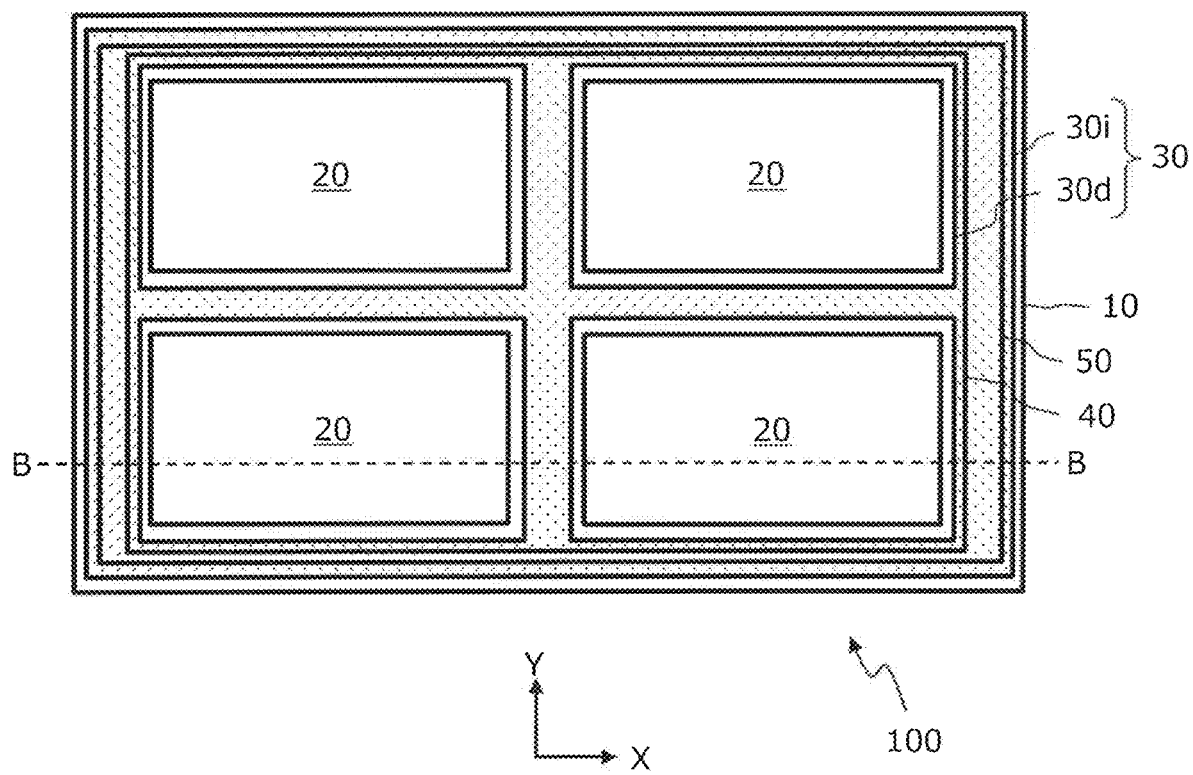
FIG. 1A is a plan view showing a configuration example of a multilayer stack used in a flexible OLED device production method of the present disclosure.
Figure 1B:
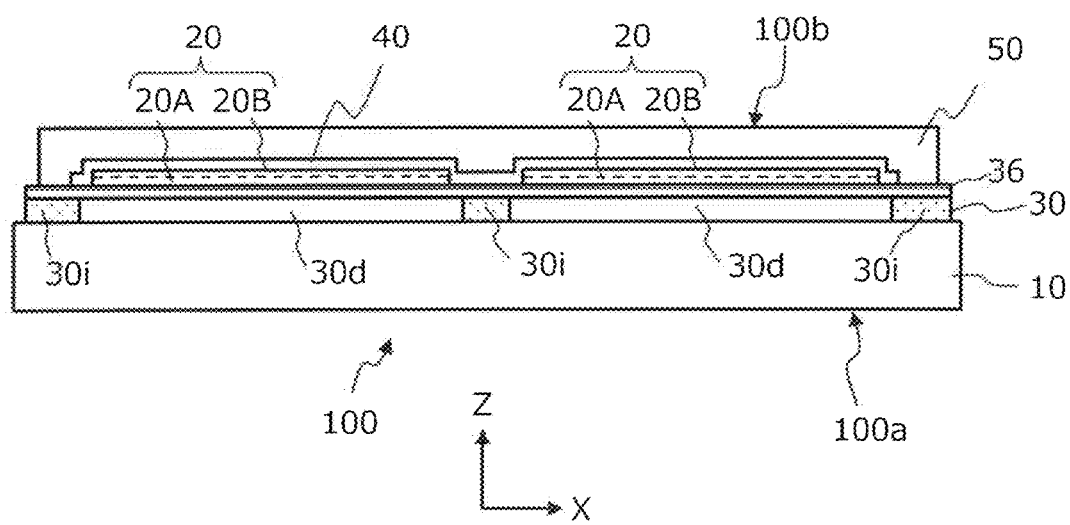
FIG. 1B is a cross-sectional, view of the multilayer stack taken along line B-B of FIG. 1A.

See FIG. 1A and FIG. 1B. In a flexible OLED device production method of the present embodiment, firstly, a multilayer stack 100 illustrated in FIG. 1A and FIG. 1B is provided. FIG. 1A is a plan view of the multilayer stack 100. FIG. 1B is a cross-sectional view of the multilayer stack 100 taken along line B-B of FIG. 1A. In FIG. 1A and FIG. 1B, an XYZ coordinate system with X-axis, Y-axis and Z-axis, which are perpendicular to one another, is shown for reference.

The multilayer stack 100 of the present embodiment includes a base (motherboard or carrier) 10, a flexible film 30 provided between the base 10 and the functional layer regions 20 such that the flexible film 30 supports the functional layer regions 20, and a dielectric multilayer film mirror (dielectric reflecting film) 36 provided between the flexible film 30 and the functional layer regions 20. The functional layer regions 20 include a TFT layer 20A and an OLED layer 20B. This multilayer stack 100 further includes a protection sheet 50 covering the plurality of functional layer regions 20 and a gas barrier film 40 provided between the plurality of functional layer regions 20 and the protection sheet 50 so as to cover the entirety of the functional layer regions 20. The multilayer stack 100 may include another unshown layer, such as a buffer layer.

A typical example of the base 10 is a glass base which has rigidity. A typical example of the flexible film 30 is a synthetic resin film which has flexibility. Hereinafter, the "flexible film" is simply referred to as "plastic film". A structure which includes the dielectric multilayer film mirror 36, the flexible film 30 supporting the dielectric multilayer film mirror 36, and the base 10 supporting the flexible film 30, as a whole, is referred to as a "supporting substrate" of a flexible OLED device.

In the present embodiment, the first surface 100a of the multilayer stack 100 is defined by the base 10. The second surface 100b of the multilayer stack 100 is defined by the protection sheet 50. The base 10 and the protection sheet 50 are materials temporarily used in the production process but are not constituents of a final flexible OLED device.

The plastic film 30 shown in the drawings includes a plurality of flexible substrate regions 30d respectively supporting the plurality of functional layer regions 20, and an intermediate region 30i surrounding each of the flexible substrate regions 30d. The flexible substrate regions 30d and the intermediate region 30i are merely different portions of a single continuous plastic film 30 and do not need to be physically distinguished. In other words, regions of the plastic film 30 lying immediately under respective ones of the functional layer regions 20 are the flexible substrate regions 30d, and the other region of the plastic film 30 is the intermediate region 30i.

Each of the plurality of functional layer regions 20 is a constituent of a final flexible OLED device. In other words, the multilayer stack 100 has such a structure that a plurality of flexible OLED devices which are not yet divided from one another are supported by a single base 10. Each of the functional layer regions 20 has such a shape that, for example, the thickness (size in 2-axis direction) is several tens of micrometers, the length (size in X-axis direction) is about 12 cm, and the width (size in Y-axis direction) is about 7 cm. These sizes can be set to arbitrary values according to the required largeness of the display screen. The shape in the XY plane of each of the functional layer regions 20 is rectangular in the example illustrated in the drawings but is not limited to this example. The shape in the XY plane of each of the functional layer regions 20 may include a square, a polygon, or a shape which includes a curve in the contour.

As shown in FIG. 1A, the flexible substrate regions 30d are two-dimensionally arrayed in rows and columns according to the arrangement of the flexible OLED devices. The intermediate region 30i consists of a plurality of stripes perpendicular to one another and forms a grid pattern. The width of the stripes is, for example, about 1-4 mm. The flexible substrate region 30d of the plastic film 30 functions as the "flexible substrate" in each flexible OLED device which is in the form of a final product. Meanwhile, the intermediate region 30i of the plastic film 30 is not a constituent of the final product.

In an embodiment of the present disclosure, the configuration of the multilayer stack 100 is not limited to the example illustrated in the drawings. The number of functional layer regions 20 (the number of OLED devices) supported by a single base 10 does not need to be plural but may be singular. When the number of functional layer regions 20 is singular, the intermediate region 30i of the plastic film 30 forms a simple frame pattern which surrounds a single functional layer region 20.

The size or proportion of each component illustrated in respective drawings is determined from the viewpoint of understandability. The actual size or proportion is not necessarily reflected in the drawings.

Supporting Substrate

Figure 2A:
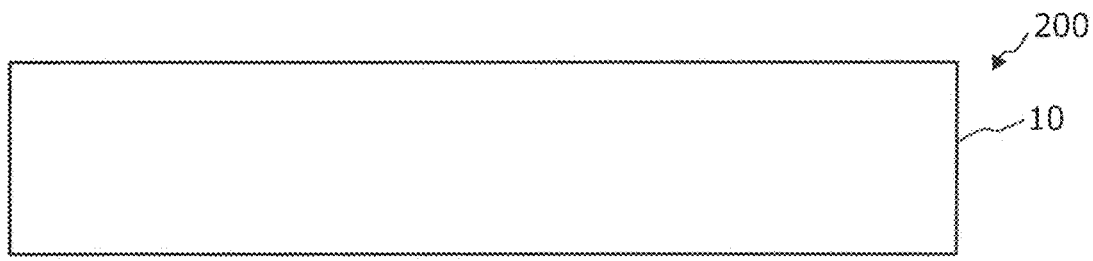
FIG. 2A is a cross-sectional view illustrating a step of a supporting substrate production method in an embodiment of the present disclosure.
Figure 2B:
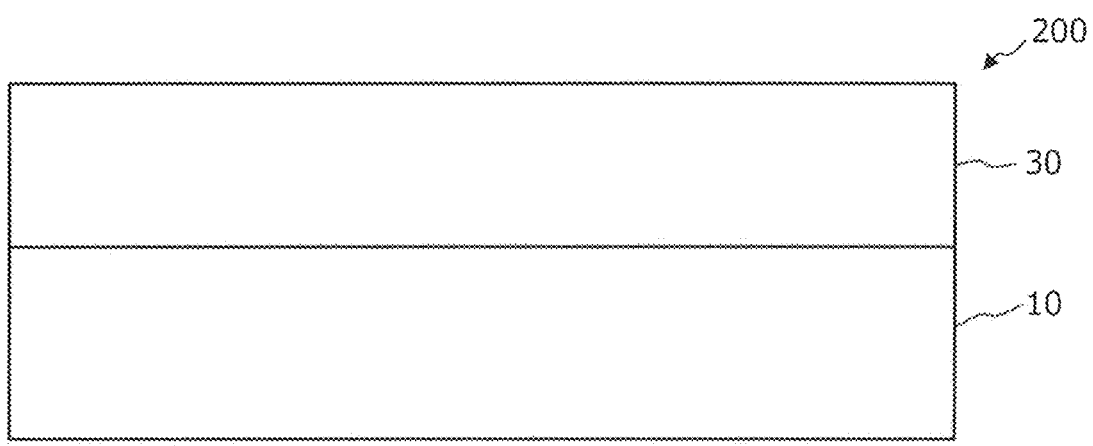
FIG. 2B is a cross-sectional view illustrating a step of the supporting substrate production method in an embodiment of the present disclosure.

A supporting substrate and a supporting substrate production method of an embodiment of the present disclosure are described with reference to FIG. 2A and FIG. 2B. FIG. 2A and FIG. 2B are cross-sectional views illustrating steps of a method for producing a supporting substrate 200 in an embodiment of the present disclosure.

<Base>

Firstly, a base 10 is provided as shown in FIG. 2A. The base 10 is a carrier substrate for the process. The thickness of the base 10 is, for example, about 0.3-0.7 mm. The base 10 is typically made of glass. The base 10 is required to be capable of transmitting lift-off light which is to be applied at subsequent steps.

<Plastic Film>

Next, as shown in FIG. 2B, a plastic film 30 is formed on the base 10. In the present embodiment, the plastic film 30 is a polyimide film having a thickness of, for example, not less than 5 urn and not more than 20 urn, for example a thickness of about 10 urn. The polyimide film can be formed from a polyamide acid, which is a precursor of polyimide, or a polyimide solution. The polyimide film may be formed by forming a polyamide acid film on the surface, of the supporting substrate 200 and then thermally imidizing the polyamide acid film. Alternatively, the polyimide film may be formed by forming, on the surface of the base 10, a film from a polyimide solution which is prepared by melting a polyimide or dissolving a polyimide in an organic solvent. The polyimide solution can be obtained by dissolving a known polyimide in an arbitrary organic solvent. The polyimide solution is applied to the surface of the base 10 and then dried, whereby a polyimide film can be formed.

In the case of a bottom emission type flexible display, it is preferred that the polyimide film realizes high transmittance over the entire range of visible light. The transparency of the polyimide film can be represented by, for example, the total light transmittance in accordance with JIS K7105-1981. The total light transmittance can be set to not less than 80% or not less than 65%. On the other hand, in the case of a top emission type flexible display, it is not affected by the transmittance. The refractive index of the polyimide film is, for example, about 1.7.

The plastic film 30 may be a film which is made of a synthetic resin other than polyimide. Note that, however, in the embodiment of the present disclosure, the process of forming a thin film transistor includes a heat treatment at, for example, not less than 350° C., and therefore, the plastic film 30 is made of a material which will not be deteriorated by this heat treatment.

The plastic film 30 may be a multilayer structure including a plurality of synthetic resin films. In one form of the present embodiment, in delaminating a flexible display structure from the base 10, a lift-off light irradiation step is carried out such that the plastic film 30 is irradiated with ultraviolet laser light (wavelength: 300-360 nm) transmitted through the base 10. A release layer which absorbs ultraviolet laser light and emits hydrogen gas, such as a noncrystalline silicon layer, may be provided between the base 10 and the plastic film 30. In a delamination step which will be described later, part of the plastic film 30 (layered part) is gasified by the irradiation with ultraviolet laser light at the interface between the base 10 and the plastic film 30, so that the plastic film 30 can be delaminated from the base 10. Providing the release layer achieves the effect of suppressing generation of ashes.

In the embodiment of the present disclosure, a dielectric multilayer film mirror 36 which will be described below functions as an ultraviolet transmission suppressing layer in the lift-off light irradiation step. As a result, entry of ultraviolet laser light from the base 10 into the functional layer regions 20, which would deteriorate the characteristics of the TFT layer 20A and the OLED layer 20B, is avoided or suppressed.

It has generally been believed that even if the transparency of the plastic film 30 is high, the plastic film 30 absorbs almost all of ultraviolet light. However, the plastic film 30 used in the flexible OLED device is an extremely thin layer and, therefore, in the lift-off light irradiation step, ultraviolet laser light can reach the functional layer regions 20. Ultraviolet laser light can deteriorate not only the characteristics of the TFT layer 20A and the OLED layer 20B but also the encapsulation performance of the organic film and the inorganic film which are constituents of the encapsulation structure. Furthermore, since a plastic film 30 which is presently used in a wide variety of applications is made of a polyimide material which is yellowish brown or reddish brown in color, it is not recognized that transmission of ultraviolet laser light can deteriorate the characteristics of the functional layer regions. This is because such a polyimide material of low transparency strongly absorbs ultraviolet laser light. However, according to research by the present inventor, even if the plastic film 30 has low transparency, ultraviolet laser light can reach the functional layer regions 20 so long as the thickness of the plastic film 30 is, for example, only about 5-20 µm. Thus, the method of the embodiment of the present disclosure is suitably used not only for production of an OLED device which includes a plastic film (flexible substrate) which is made of a material which has high transparency and which is likely to transmit ultraviolet light but also for production of an OLED device which includes a plastic film 30 which has low transparency and which has a small thickness (thickness: about 5-20 µm).

When there is an object (target) which is to be polished away, such as particles or protuberances, on the surface of the plastic film 30, the target may be polished away using a polisher such that the surface becomes flat. Detection of a foreign object, such as particles, can be realized by, for example, processing of an image obtained by an image sensor. After the polishing process, a planarization process may be performed on the surface of the plastic film 30. The planarization process includes the step of forming a film which improves the flatness (planarization film) on the surface of the plastic film 30. The planarization film does not need to be made of a resin.

<Dielectric Multilayer Film Mirror>

Figure 2C:
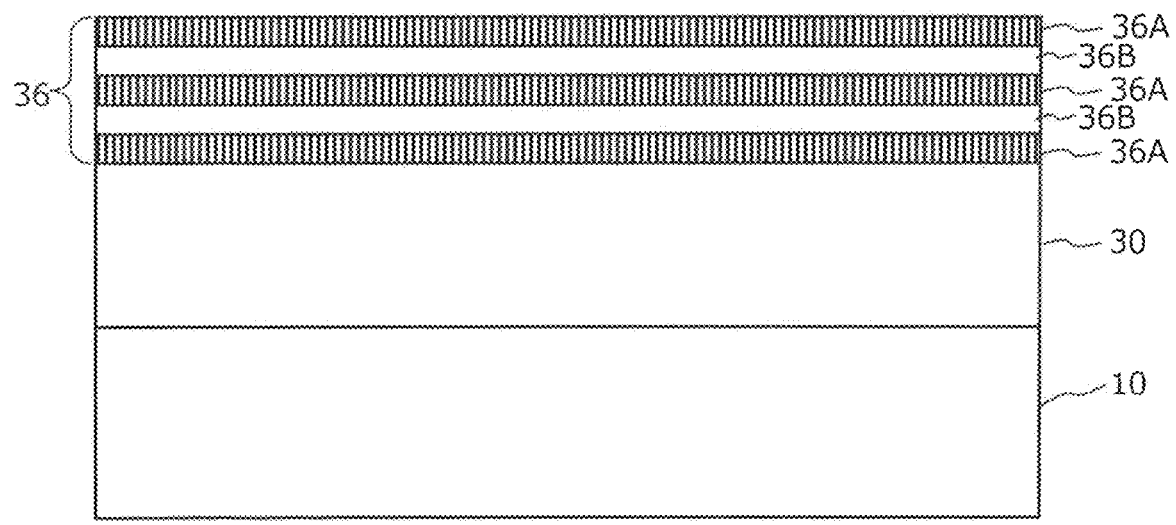
FIG. 2C is a cross-sectional view illustrating a step of the supporting substrate production method in an embodiment of the present disclosure.

Next, as shown in FIG. 2C, a dielectric multilayer film mirror 36 is formed on the plastic film 30.

In the present disclosure, the "dielectric multilayer film mirror" refers to a multi-layer stack consisting of k dielectric layers where k is an integer not less than 5, in which the optical thicknesses of the respective dielectric layers are adjusted such that light-reflected by the interfaces of the dielectric layers which have mutually different refractive indices causes constructive interference.

Counting the dielectric layers which are constituents of the dielectric multilayer film mirror from the side where the lift-off light comes in, the layer is referred to as "dielectric layer (i)". i is an integer not less than 1 and not more than k. The dielectric layer (i) has refractive index $n(i)$ and thickness $d(i)$. In an embodiment of the present disclosure, when i is an odd number, $n(i+1)$ is lower than $n(i)$ and $n(i+2)$. Therefore, an odd-numbered dielectric layer (odd number) is referred to as "high refractive index layer", and an even-numbered dielectric layer (even number) is referred to as "low refractive index layer".

The optical thickness of the dielectric layer (i) is defined by $n(i) \times d(i)$. Where the wavelength of the lift-off light in vacuum is $\lambda$, the optical thickness in the present embodiment, i.e., $n(i) \times d(i)$, is identical with $\lambda/4$. When $n(i) \times d(i) = \lambda/4$ holds true, all of the "high refractive index layers" do not need to have equal refractive indices and equal thicknesses. Likewise, all of the "low refractive index layers" do not need to have equal refractive indices and equal thicknesses. Note that, however, typically, the "high refractive index layers" are made of the same material which has the same refractive index, and therefore, the respective "high refractive index layers" have equal thicknesses. Also, typically, the "low refractive index layers" are made of the same material which has the same refractive index, and therefore, the respective "low refractive index layers" have equal thicknesses. Note that, however, the embodiment of the present disclosure is not limited to such an example.

In the example shown in FIG. 2C, the dielectric multilayer film mirror 36 includes five dielectric layers: a dielectric layer (1), a dielectric layer (2), a dielectric layer (3), a dielectric layer (4), and a dielectric layer (5). The dielectric layer (1), the dielectric layer (3) and the dielectric layer (5) are high refractive index layers 36A. The dielectric layer (2) and the dielectric layer. (4) are low refractive index layers 36B. In other words, the dielectric multilayer film mirror 36 in the example of the drawing includes three or more high refractive index layers 36A each having the first refractive index and two or more low refractive index layers 36B each having the second refractive index that is lower than the first refractive index and provided between the three or more high refractive index layers 36A. In the terms "high refractive index layer" and "low refractive index layer", "high" and "low" do not mean the absolute magnitude but only mean the relative relationship in refractive index between dielectric layers which adjoin so as to form an interface.

The high refractive index layers can be made of, for example, at least one material selected from the group consisting of $Si_3N_0$, $SiN_x$, $Al_2O_3$, $HfO_2$, $Sc_2O_3$, $Y_2O_3$, $ZrO_2$, $Ta_2O_5$, $TiO_2$ and $Nb_2O_5$. The low refractive index layers can be made of, for example, at least one material selected from the group consisting of $SiO_2$, $MgF_2$, $CaF_2$, $AlF_3$, $YF_3$, $LiF$ and $NaF$. The "high refractive index layers" included in a single dielectric multilayer film mirror 36 may be made of a plurality of types of materials which have different refractive indices. In that sense, the "first refractive index" is not limited to a singular number. The terms "low refractive index layer" and "second refractive index" can also be interpreted in the same way.

The reflectance at the interface between a high refractive index layer and a low refractive index layer becomes higher as the difference in refractive index between the high refractive index layer and the low refractive index layer increases. Therefore, it is preferred that the material is selected such that the difference in refractive index is large. The low refractive index layers are suitably made of, for example, a fluoric material, and the refractive index of the material is desirably less than 1.5. The high refractive index layers are suitably made of, for example, a silicon nitride or an oxide of a metal such as tantalum (Ta), hafnium (Hf), yttrium (Y) or niobium (Nb), and the refractive index of the material is desirably not less than 1.7.

The refractive index of the plastic film 30 varies depending on the materials of the synthetic resin. The refractive index of the synthetic resin is typically in the range of about 1.5 to 1.7. Thus, when the dielectric multilayer film mirror 36 is in direct contact with the resin material of the plastic film 30, a high refractive index layer 36A included in the dielectric multilayer film mirror 36 is arranged so as to be in contact with the resin material. This arrangement can improve the reflectance at the interface between the plastic film 30 and the high refractive index layer 36A.

In the example illustrated in the drawing, when the lift-off light passes through the base 10 and the plastic film 30 and reaches the dielectric multilayer film mirror 36, part of the lift-off light is first reflected by the interface between the high refractive index layer 36A which is the dielectric layer (1) and the plastic film 30. Light which has passed through this interface then repeats reflection and passage at the interface between the dielectric layer (1) and the dielectric layer (2), the interface between the dielectric layer (2) and the dielectric layer (3), the interface between the dielectric layer (3) and the dielectric layer (4), and the interface between the dielectric layer (4) and the dielectric layer (5). When the lift-off light enters from a high refractive index layer 36A to a low refractive index layer 36B, a so-called fixed end reflection occurs at the interface between these layers so that the phase shifts by π, i.e., a half wavelength. In contrast, when the lift-off light enters from a low refractive index layer 36B to a high refractive index layer 36A, a so-called open end reflection occurs at the interface between these layers so that the phase does not shift. Therefore, when the optical thickness of each of the high refractive index layer 36A and the low refractive index layer 36B is adjusted to $\lambda/4$, the phases of reflection at the respective interfaces are identical so that constructive interference of reflected light is realized. To achieve the effects of the present invention, the optical thickness does not need to be strictly identical with the value of $\lambda/4$, and a deviation of not more than ±20% is allowable. The optical thickness under the condition that reflected light from the respective interfaces realize constructive interference may be, more generally, $\lambda/4+(L\times\lambda/2)$. Herein, L is an integer not less than 0.

In the example illustrated in the drawing, repetition of the high refractive index layers 36A and the low refractive index layers 36B occurs with 2.5 periods. The embodiment of the present disclosure is not limited to this example. The period of repetition of the high refractive index layers 36A and the low refractive index layers 36B may be 2 periods or 3 or more periods.

For a configuration example of the dielectric multilayer film mirror 36 which is adoptable in the embodiment of the present disclosure, the reflectance was determined by simulation. The results of this simulation will be described later.

The dielectric multilayer film mirror 36 is produced by alternately forming the high refractive index layers 36A and the low refractive index layers 36B according to a thin film deposition technique such as vapor deposition. The high refractive index layers 36A and the low refractive index layers 36B are, typically, continuous films but may be patterned. The dielectric multilayer film mirror 36 only need to be present in such a region that the dielectric multilayer film mirror 36 can prevent the lift-off light from entering the TFT layer 20A and the OLED layer 20B.

When a plastic film 30 in the form of a sheet is adhered to the base 10, the dielectric multilayer film mirror 36 may be formed on the plastic film 30 before the plastic film 30 is adhered to the base 10.

The dielectric multilayer film mirror 36 is a member which can perform an optical function in irradiating with the lift-off light at the lift-off step. Further, when used as a flexible OLED device, the dielectric multilayer film, mirror 36 can also perform the function of preventing ultraviolet light included in the ambient light from entering the TFT layer 20A and the OLED layer 20B and deteriorating these layers over time. Furthermore, the dielectric multilayer film mirror 36 can perform not only the optical function but also the function of a gas barrier film which will be described below.

<Lower Gas Barrier Film>

Figure 3A:
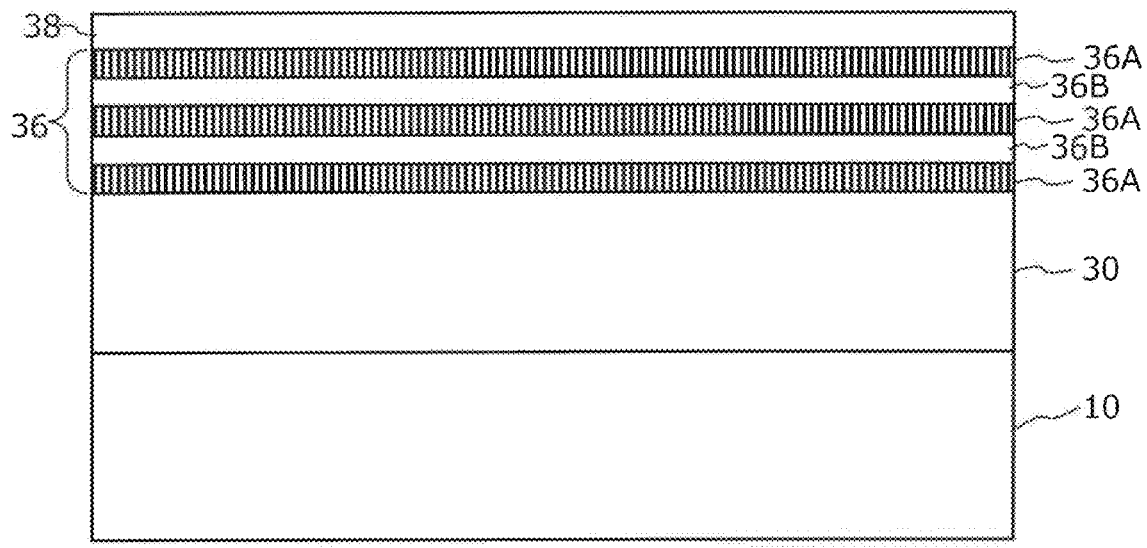
FIG. 3A is a cross-sectional view illustrating a step of a flexible OLED device production method in an embodiment of the present disclosure.

Then, a gas barrier film 38 is formed on the dielectric multilayer film mirror 36 as shown in FIG. 3A. The gas barrier film 38 can have various structures. Examples of the gas barrier film include a silicon oxide film and a silicon nitride film. Other examples of the gas barrier film can include a multilayer film including an organic material layer and an inorganic material layer. This gas barrier film may be referred to as "lower gas barrier film" so as to be distinguishable from a gas barrier film covering the functional layer regions 20, which will be described later. The gas barrier film covering the functional layer regions 20 can be referred to as "upper gas barrier film".

The gas barrier film 38 may be in contact with the high refractive index layer 36A or the low refractive index layer 36B which is a constituent of the dielectric multilayer film mirror 36. Alternatively, another layer may be interposed between the gas barrier film 38 and the dielectric multilayer film mirror 36. When the gas barrier film 38 and the dielectric multilayer film mirror 36 are in direct contact with each other, it is preferred that the lift-off light is strongly reflected by the interface between the gas barrier film 38 and the dielectric multilayer film mirror 36. Thus, it is desirable that the dielectric layer which is in contact with the gas barrier film 38 is made of a material whose refractive index is substantially different from the refractive index of the gas barrier film 38.

Functional Layer Region

Next, the process of forming the functional layer regions 20, including the TFT layer 20A and the OLED layer 20B, and the upper gas barrier film 40 is described. More specifically, the functional layer regions 20 include a TFT layer 20A (lower, layer) and an OLED layer 20B (upper layer). The TFT layer 20A and the OLED layer 20B are sequentially formed by a known method. The TFT layer 20A includes a circuit of a TFT array which realizes an active matrix. The OLED layer 20B includes an array of OLED elements, each of which can be driven independently. The thickness of the TFT layer 20A is, for example, 4 μm. The thickness of the OLED layer 20B is, for example, 1 μm.

<TFT Layer>

Figure 3B:
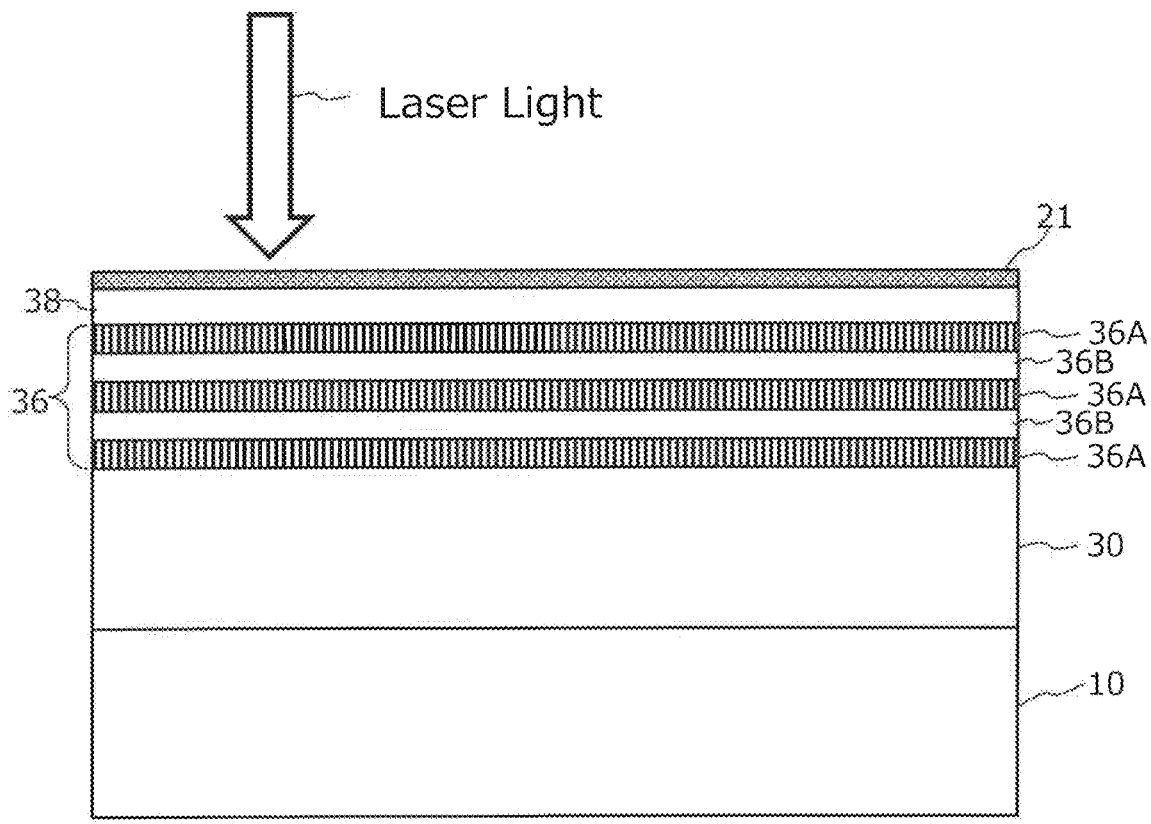
FIG. 3B is a cross-sectional view illustrating a step of the flexible OLED device production method in an embodiment of the present disclosure.

First, as shown in FIG. 3B, a semiconductor layer 21 is formed on the lower layer gas barrier film 38. The semiconductor layer is non-crystalline at this point in time. To polycrystallize (reform) at least part of the semiconductor layer 21, the semiconductor layer 21 is irradiated with laser light. In this step, there is a probability that part of the laser light will pass through the semiconductor layer 21 and reach the dielectric multilayer film mirror 36. If the laser light is reflected by the dielectric multilayer film mirror 36 and enters the semiconductor layer 21, there is a probability that the heat treatment conditions for the semiconductor layer 21, such as temperature rise rate, will vary as compared with a case where the dielectric multilayer film mirror 36 is not provided.

However, when the semiconductor layer 21 is made of silicon, there is a large difference in refractive index between the lower layer gas barrier film 38 and the semiconductor layer 21. Specifically, when the lower layer gas barrier film 38 is made of, for example, $SiN_x$ (refractive index: about 1.9), a large difference in refractive index occurs at the interface because the refractive index of silicon is not less than 4, and the laser light is strongly reflected by this interface. Therefore, the effect caused by passage of the laser light through this interface and reflection by the dielectric multilayer film mirror 36 is small. This means that it is not necessary to change the laser light irradiation conditions for polycrystallization of the semiconductor layer 21 based on the presence/absence of the dielectric reflection mirror.

If the wavelength of the laser light for polycrystallization of the semiconductor layer is different from the wavelength of the lift-off light, the reflectance of the dielectric multilayer film mirror 36 is optimized according to the wavelength of the lift-off light. Therefore, the thus-optimized dielectric multilayer film mirror 36 does not strongly reflect light of other wavelengths so that, naturally, the semiconductor polycrystallization conditions are unlikely to vary.

Figure 3C:
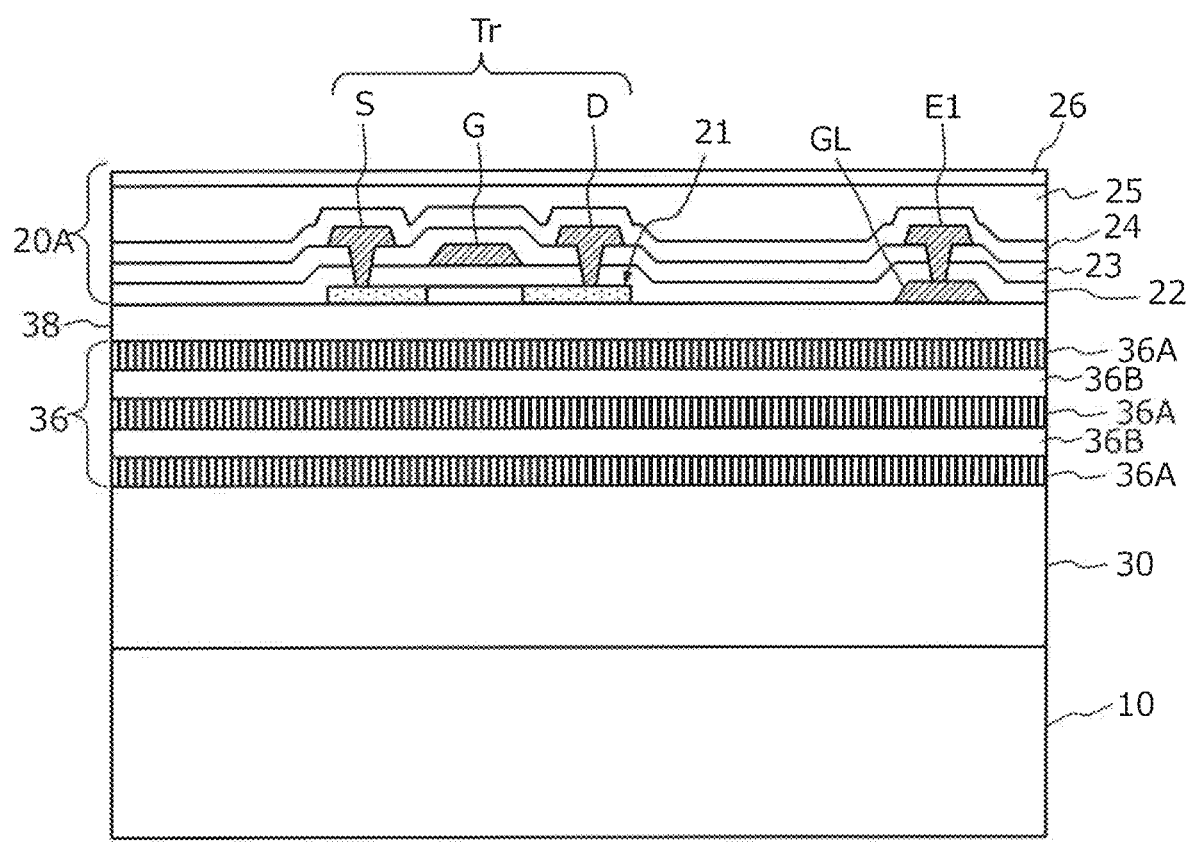
FIG. 3C is a cross-sectional view illustrating a step of the flexible OLED device production method in an embodiment of the present disclosure.

Then, as shown in FIG. 3C, a TFT layer 20A is formed through a known TFT production process. Specifically, after the semiconductor layer 21 is patterned, a ground line GL is formed. After a gate insulating film 22 is formed, a gate electrode G is formed so as to cover the channel region of the semiconductor layer 21. By ion implantation, a source-drain region which is self-aligned with the gate electrode G is formed in the semiconductor layer 21. After an interlayer insulating film 23 is deposited, contact holes are formed, and a source electrode S and a drain electrode D of a transistor Tr and an electrode E1 on the ground line GL are formed. After a first inorganic barrier layer 24 is deposited so as to cover these components, an organic planarization film 25 and a second inorganic barrier layer 26 are formed. In this way, the TFT layer 20A is formed. The configuration and the production method of the TFT layer 20A are not limited to this example but can be diverse.

<OLED Layer>

Figure 3D:
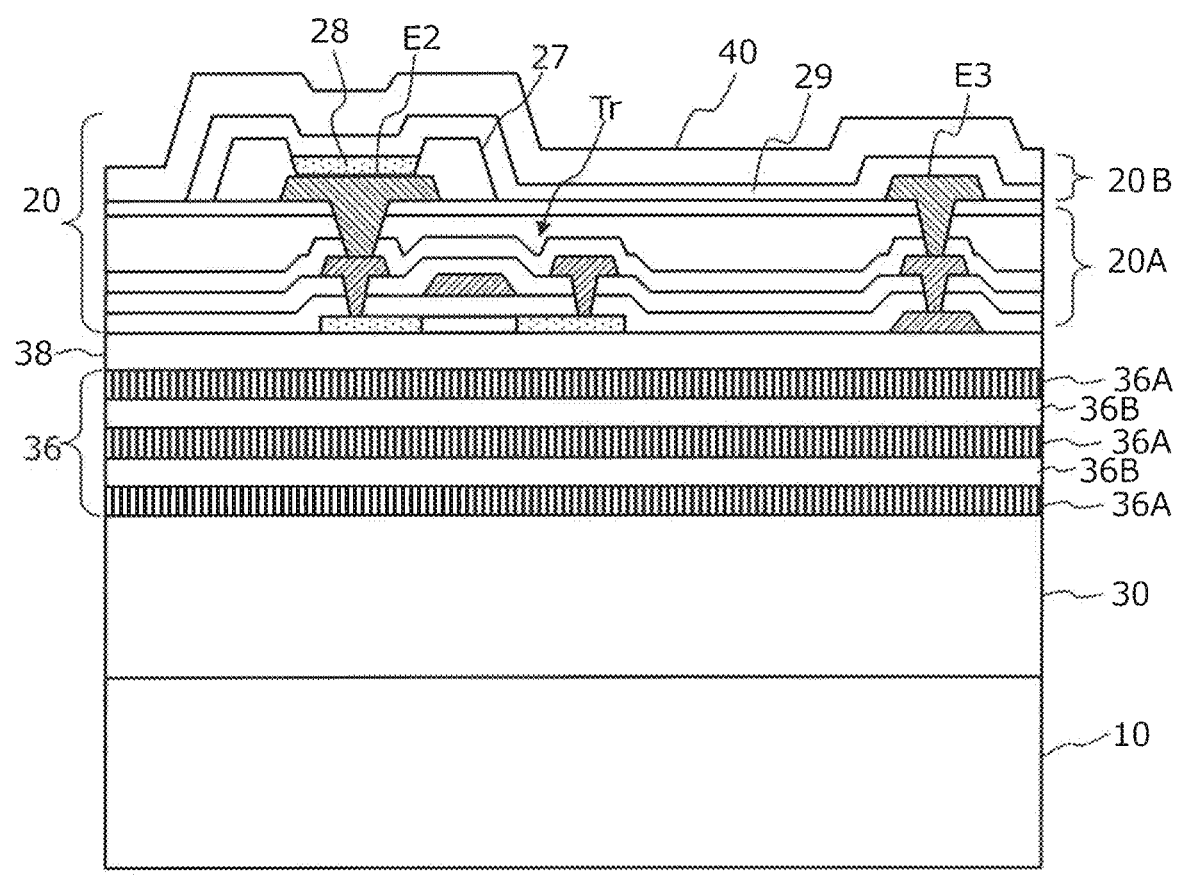
FIG. 3D is a cross-sectional view illustrating a step of the flexible OLED device production method in an embodiment of the present disclosure.

Then, as shown in FIG. 3D, after contact holes are formed in the organic planarization film 25 and the second inorganic barrier layer 26, an anode electrode E2 and a cathode electrode E3 of an OLED light-emitting device 28 are formed. After a bank 27 is formed, the OLED light-emitting device 28 is formed on the anode electrode E2. The OLED light-emitting device 28 includes organic semiconductor layers, such as hole transporting layer, light-emitting layer, electron transporting layer, etc. A transparent electrode 29 is formed such that the electron transporting layer and the cathode-electrode E3 of the OLED light-emitting device 28 are electrically coupled together, whereby an OLED layer 20B is formed. The configuration and the production method of the OLED layer 20B are not limited to this example but can be diverse. In this way, the functional layer region 20 is completed.

<Upper Gas Barrier Film>

After formation of the functional layer regions 20, the entirety of the functional layer regions 20 is covered with a thin film encapsulation layer (upper gas barrier film) 40 as shown in FIG. 3D. A typical example of the upper gas barrier film 40 is a multilayer film including an inorganic material layer and an organic material layer. Elements such as an adhesive film, another functional layer which is a constituent of a touchscreen, polarizers, etc., may be provided between the upper gas barrier film 40 and the functional layer regions 20 or in a layer overlying the upper gas barrier film 40. Formation of the upper gas barrier film 40 can be realized by a Thin Film Encapsulation (TFE) technique. From the viewpoint of encapsulation reliability, the WVTP (Water Vapor-Transmission Rate) of a thin film encapsulation structure is typically required to be not more than $1\times10^{-4}$ $g/m^2/day$. According to the embodiment of the present disclosure, this criterion is met. The thickness of the upper gas barrier film 40 is, for example, not more than 1.5 μm.

<Protection Sheet>

Next, a protection sheet 50 (FIG. 1B) is adhered to the upper surface of the multilayer stack 100. The protection sheet 50 can be made of a material such as, for example, polyethylene terephthalate (PET), polyvinyl chloride (PVC), or the like. As previously described, a typical example of the protection sheet 50 has a laminate structure which includes a layer of an applied mold-releasing agent at the surface. The thickness of the protection sheet 50 can be, for example, not less than 50 μm and not more than 150 μm.

After the thus-formed multilayer stack 100 is provided, the production method of the present disclosure can be carried out using the above-described production apparatus (delaminating apparatus 220).

The multilayer stack 100 which can be used in the production method of the present disclosure is not limited to the example illustrated in FIG. 1A and FIG. 1B. The protection sheet 50 may cover the entirety of the plastic film 30 and extend outward beyond the plastic film 30. Alternatively, the protection sheet 50 may cover the entirety of the plastic film 30 and extend outward beyond the base 10. As will be described later, after the base 10 is separated from the multilayer stack 100, the multilayer stack 100 is a thin flexible sheet-like structure which has no rigidity. The protection sheet 50 serves to protect the functional layer regions 20 from impact and abrasion when the functional layer regions 20 collide with or come into contact with external apparatuses or instruments in the step of delaminating the base 10 and the steps after the delaminating. Since the protection sheet 50 is peeled off from the multilayer stack 100 in the end, a typical example of the protection sheet 50 has a laminate structure which includes an adhesive layer of a relatively small adhesive force (a layer of an applied mold-releasing agent) over its surface. The more detailed description of the multilayer stack 100 will be described later.

<Equivalent Circuit>

Figure 4:
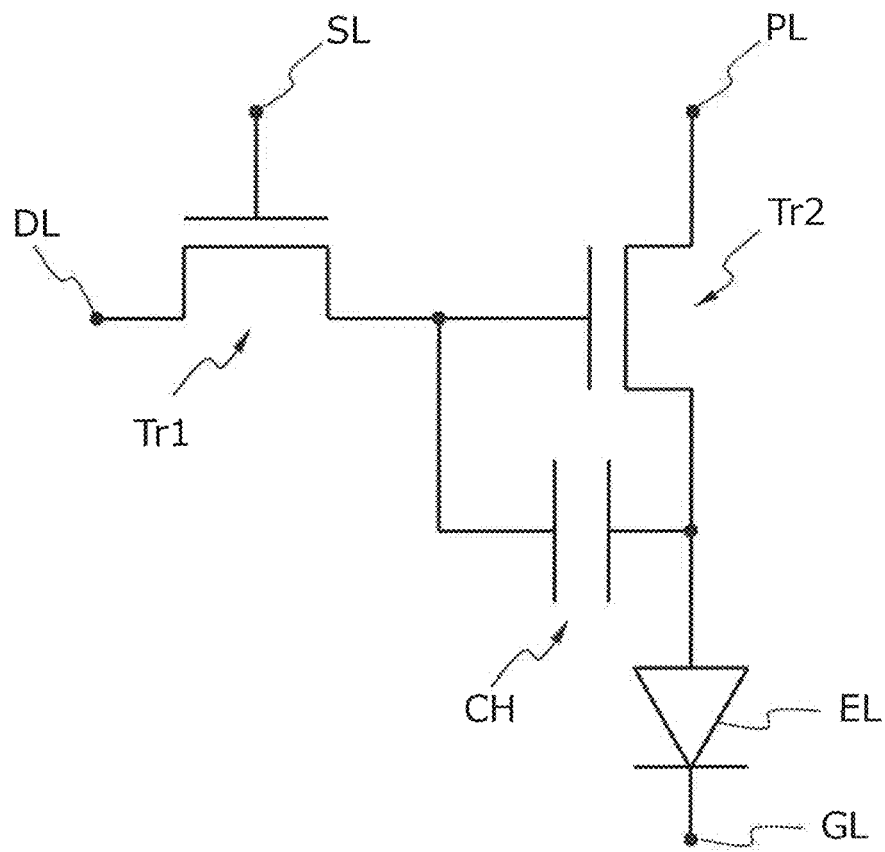
FIG. 4 is an equivalent circuit diagram of a single sub-pixel in a flexible OLED device.

FIG. 4 is a basic equivalent circuit diagram of a sub-pixel in an organic EL (Electro Luminescent) display. A single pixel of the display can consist of sub-pixels of different, colors such as, for example, R (red), G (green), and B (blue). The example illustrated in FIG. 4 includes a selection TFT element Tr1, a driving TFT element Tr2, a storage capacitor CH, and an OLED element EL. The selection TFT element Tr1 is connected with a data line DL and a selection line SL. The data line DL is a line for transmitting data signals which define an image to be displayed. The data line DL is electrically coupled with the gate of the driving TFT element Tr2 via the selection TFT element Tr1. The selection line SL is a line for transmitting signals for controlling the ON/OFF state of the selection TFT element Tr1. The driving TFT element Tr2 controls the state of the electrical connection between a power line PL and the OLED element EL. When the driving TFT element Tr2 is ON, an electric current flows from the power line PL to a ground line GL via the OLED element EL. This electric current allows the OLED element EL to emit light. Even when the selection TFT element Tr1 is OFF, the storage capacitor CH maintains the ON state of the driving TFT element Tr2. The driving TFT element Tr2 corresponds to the transistor Tr of FIG. 3D.

The TFT layer 20A includes a selection TFT element Tr1, a driving TFT element Tr2, a data line DL, and a selection line SL. The OLED layer 20B includes an OLED element EL. Before formation of the OLED layer 20B, the upper surface of the TFT layer 20A is planarized by an interlayer insulating trim that covers the TFT array and various wires. A structure which supports the OLED layer 20B and which realizes active matrix driving of the OLED layer 20B is referred to as "backplane".

The circuit elements and part of the lines shown in FIG. 4 can be included in any of the TFT layer 20A and the OLED layer 20B. The lines shown in FIG. 4 are connected with an unshown driver circuit.

In the embodiment of the present disclosure, the TFT layer 20A and the OLED layer 20B can have various specific configurations. These configurations do not limit the present disclosure. The TFT element included in the TFT layer 20A may have a bottom gate type configuration or may have a top gate type configuration. Emission by the OLED element included in the OLED layer 20B may be of a bottom emission type or may be of a top emission type. The specific configuration of the OLED element is also arbitrary.

The material of a semiconductor layer which is a constituent of the TFT element includes, for example, crystalline silicon, amorphous silicon, and oxide semiconductor. In the embodiment, of the present disclosure, part of the process of forming the TFT layer 20A includes a heat treatment, step at 350° C. or higher for the purpose of improving the performance of the TFT element.

Figure 5:
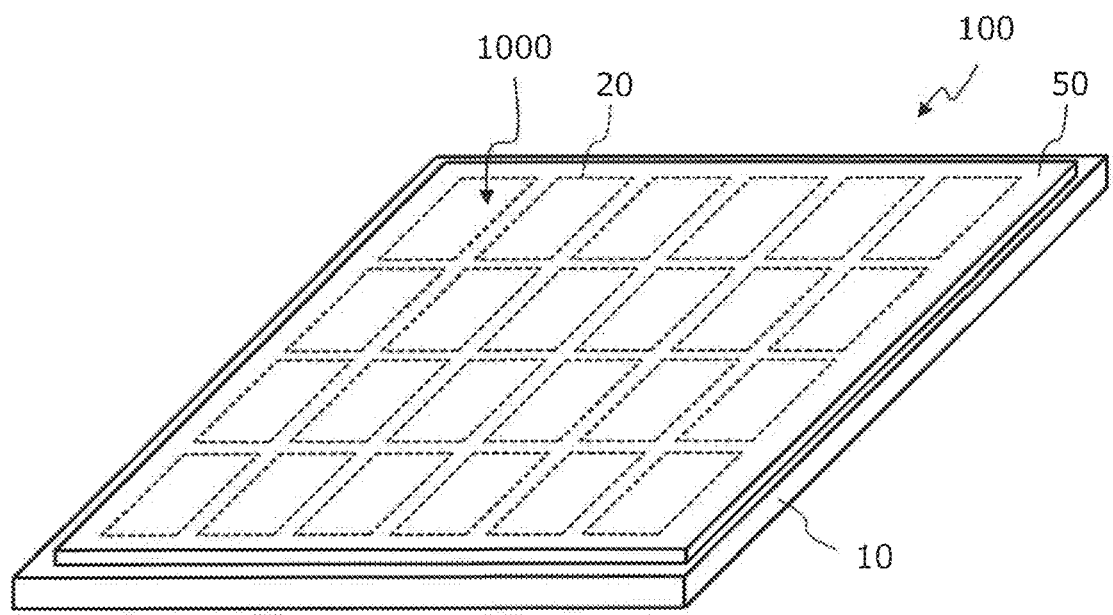
FIG. 5 is a perspective view of the multilayer stack in the middle of the production process.

FIG. 5 is a perspective view schematically showing the upper surface side of the multilayer stack 100 at a point in time when the upper gas barrier film 40 is formed. A single multilayer stack 100 includes a plurality of OLED devices 1000 supported by the base 10. In the example illustrated in FIG. 5, a single multilayer stack 100 includes a larger number of functional layer regions 20 than in the example illustrated in FIG. 1A. As previously described, the number of functional layer regions 20 supported by a single base 10 is arbitrary.

<Dividing of OLED Devices>

In the flexible OLED device production method of the present embodiment, after the step of providing the multilayer stack 100, the step of dividing an intermediate region 30i and respective ones of a plurality of flexible substrate regions 30d of the plastic film 30 from one another is carried out. The step of dividing does not need to be carried out before the LLO step but may be carried out after the LLO step.

The dividing can be realized by cutting a central portion between adjoining OLED devices using a laser beam or dicing saw. In the present embodiment, the multilayer stack exclusive of the base 10 is cut, and the base 10 is not cut. However, the base 10 may be cut such that the multilayer stack is divided info partial multilayer structures each including an OLED device and a base portion that supports the OLED device.

Hereinafter, the step of cutting the multilayer structure exclusive of the base 10 by irradiation with a laser beam is described. The positions of irradiation with a laser beam for cutting are along the periphery of each of the flexible substrate regions 30d.

Figure 6A:
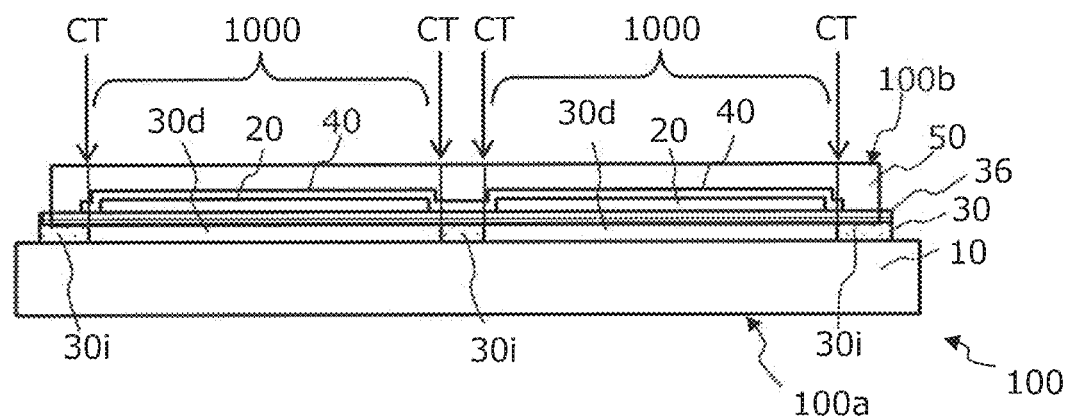
FIG. 6A is a cross-sectional view schematically showing the dividing positions in the multilayer stack.
Figure 6B:
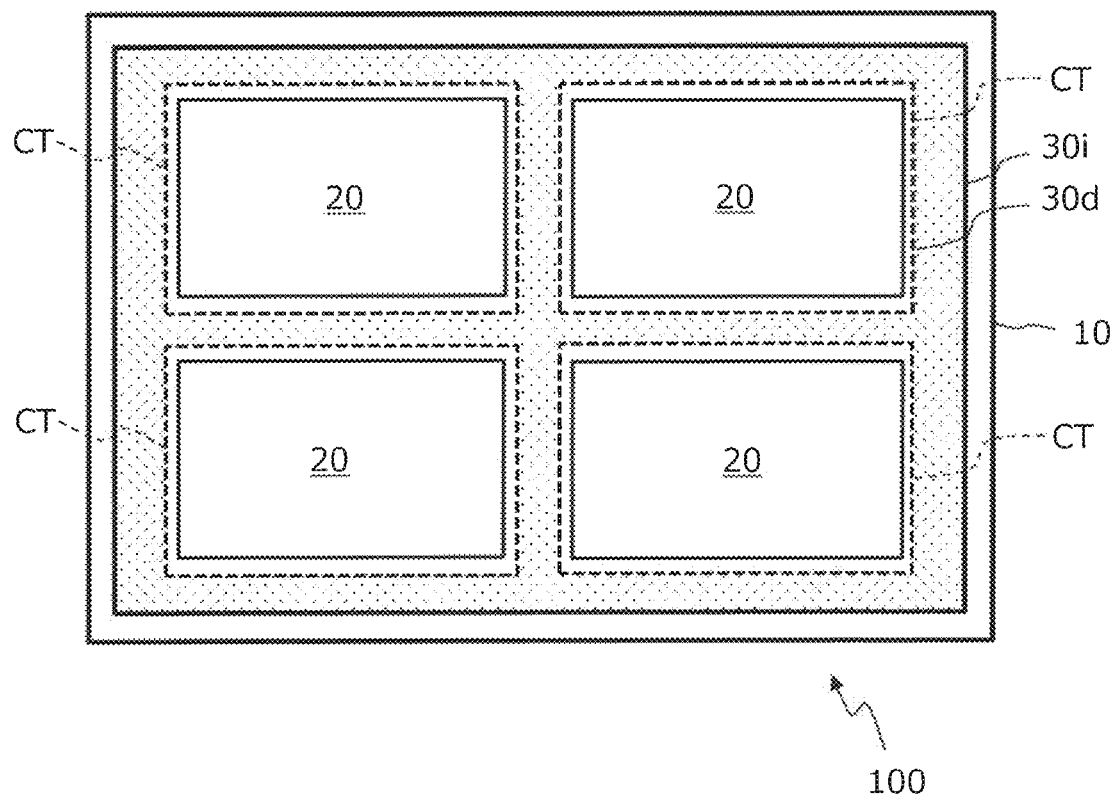
FIG. 6B is a plan view schematically showing the dividing positions in the multilayer stack.

FIG. 6A and FIG. 6B are a cross-sectional view and a plan view each schematically showing the positions at which the intermediate region 30i of the plastic film 30 and respective ones of the plurality of flexible substrate regions 30d are divided. The positions of irradiation with a laser beam for cutting are along the periphery of each of the flexible substrate regions 30d. In FIG. 6A and FIG. 6B, the irradiation positions (cut positions) CT represented by arrows or broken lines are irradiated with a laser beam for cutting, whereby the multilayer stack 100 exclusive of the base 10 is cut into the plurality of OLED devices 1000 and the remaining unnecessary portion. By the cutting, a gap of several tens of micrometers to several hundreds of micrometers is formed between each of the OLED devices 1000 and its surrounding. Such a cutting can also be realized by a dicing saw instead of laser beam irradiation as previously described. After the cutting, the OLED devices 1000 and the remaining unnecessary portion are still kept bound to the base 10.

As shown in FIG. 6B, the planar layout, of the "unnecessary portion" in the multilayer stack 100 accords with the planar layout of the intermediate region 30i of the plastic film 30. In the illustrated example, the "unnecessary portion" is a single continuous sheet-like structure which has openings. However, the embodiments of the present disclosure are not limited to this example. The irradiation positions CT with the laser beam for cutting may be set such that the "unnecessary portion" is separated into a plurality of portions. Note that the sheet-like structure, which is the "unnecessary portion", includes not only the intermediate region 30i of the plastic film 30 but also cut portions of layered components on the intermediate region 30i (e.g., the gas barrier film 40 and the protection sheet 50).

When the cutting is realized by a laser beam, the wavelength of the laser beam may be in any of the infrared, visible and ultraviolet bands. From the viewpoint of reducing the effect of the cutting on the base 10, the laser beam desirably has a wavelength in the range of green to ultraviolet. For example, when a Nd:YAG laser device is used, the cutting can be carried out using a second harmonic wave (wavelength: 532 nm) or a third harmonic wave (wavelength: 0.343 nm or 355 nm). In such a case, the laser power is adjusted to 1 to 3 watts, and the scanning rate is set to about 500 mm per second, so that the multilayer structure supported by the base 10 can be cut (divided) into OLED devices and unnecessary portions without damaging the base 10.

According to the embodiment of the present disclosure, the timing of the above-described cutting is earlier than in the prior art. Since the cutting is carried out while the plastic film 30 is bound to the base 10, alignment for the cutting can be made with high precision and accuracy even if the gap between adjoining OLED devices 1000 is narrow. Thus, the gap between adjoining OLED devices 1000 can be shortened, and accordingly, useless portions which are unnecessary for a final, product can be reduced.

<Lift-Off Light Irradiation>

Figure 7A:
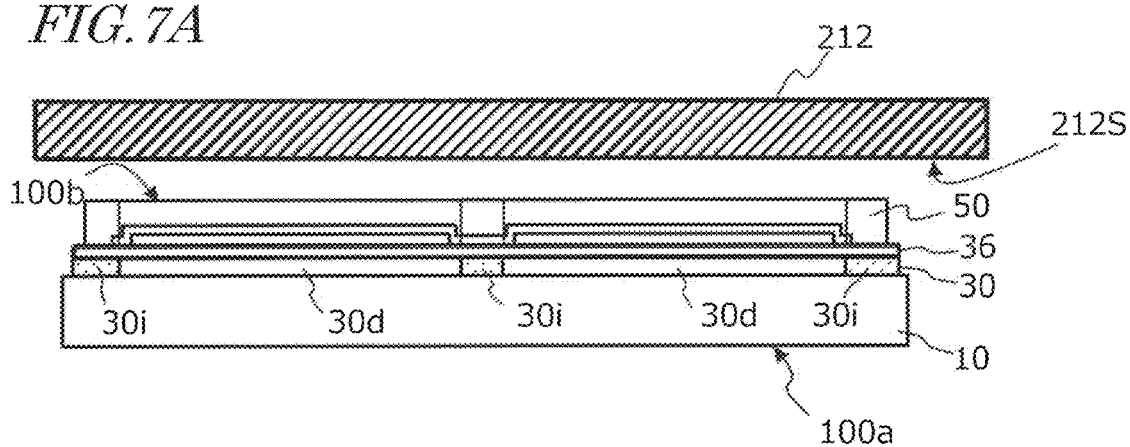
FIG. 7A is a diagram schematically showing a state immediately before a stage supports a multilayer stack.

FIG. 7A schematically shows a state in an unshown production apparatus (delaminating apparatus) immediately before the stage 212 supports the multilayer stack 100. In the present embodiment, the stage 212 is a chuck stage which has a large number of pores in the surface for suction. The configuration of the chuck stage is not limited to this example. It may include an electrostatic chuck for supporting the multilayer stack or any other fixing device. The multilayer stack 100 is arranged such that the second surface 100b of the multilayer stack 100 faces the surface 212S of the stage 212, and is in close contact with the stage 212.

Figure 7B:
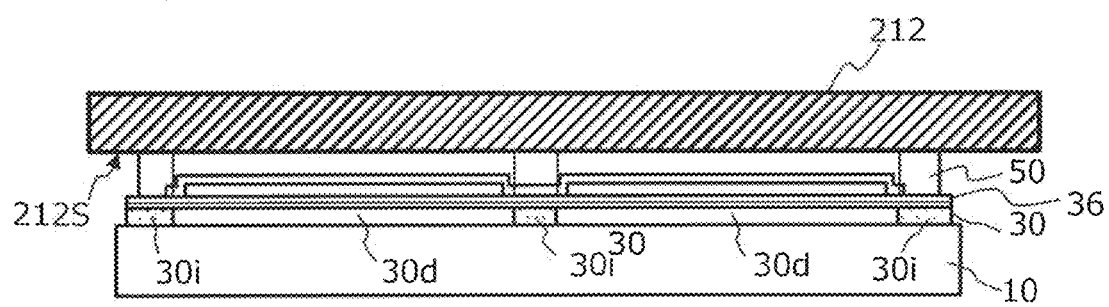
FIG. 7B is a diagram schematically showing a state where the stage supports the multilayer stack.

FIG. 7B schematically shows a state where the stage 212 supports the multilayer stack 100. The arrangement of the stage 212 and the multilayer stack 100 is not limited to the example illustrated in the drawing. For example, the multilayer stack 100 may be placed upside down such that the stage 212 is present under the multilayer stack 100.

In the example illustrated in FIG. 7B, the multilayer stack 100 is in contact with the surface 212S of the stage 212, and the stage 212 holds the multilayer stack 100 by suction.

Figure 7C:
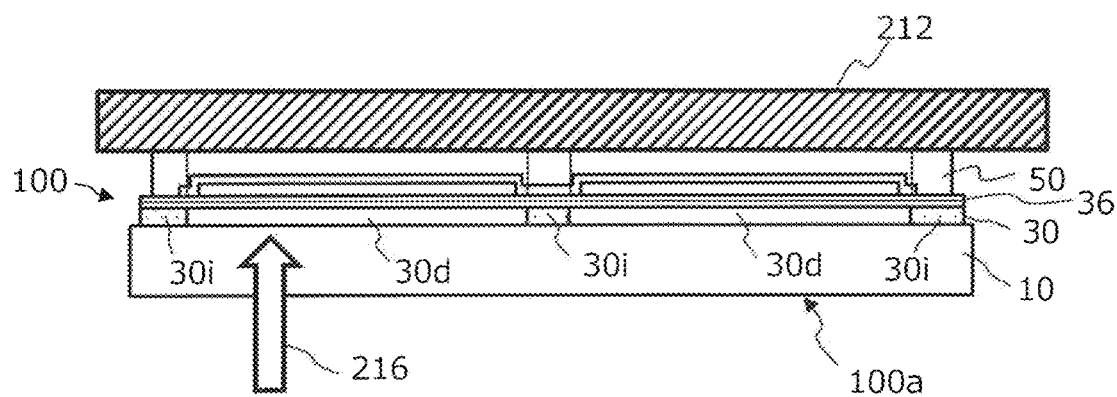
FIG. 7C is a diagram schematically showing that the interface between a base and a plastic film of the multilayer stack with laser light (lift-off light) in the shape of a line.

Then, as shown in FIG. 1C, the interface between the plastic film 30 and the base 10 is irradiated with ultraviolet laser light (lift-off light) 216. FIG. 7C schematically illustrates irradiation of the plastic film 30 at the base 10 side with the lift-off light 216 in the shape of a line extending in a direction vertical to the sheet of the drawing. The plastic film 30 absorbs ultraviolet laser light to be heated within a short time period. A part of the plastic film 30 at the interface between the base 10 and the plastic film 30 gasifies or decomposes (disappears). By scanning the plastic film 30 with the lift-off light 216, the degree of binding of the plastic film 30 to the base 10 is reduced. The wavelength of the lift-off light. 216 is in the ultraviolet band. The light absorption by the base 10 is, for example, about 10% in the wavelength range of 343-355 nm but can increase to 30-60% at 308 nm.

Figure 7D:
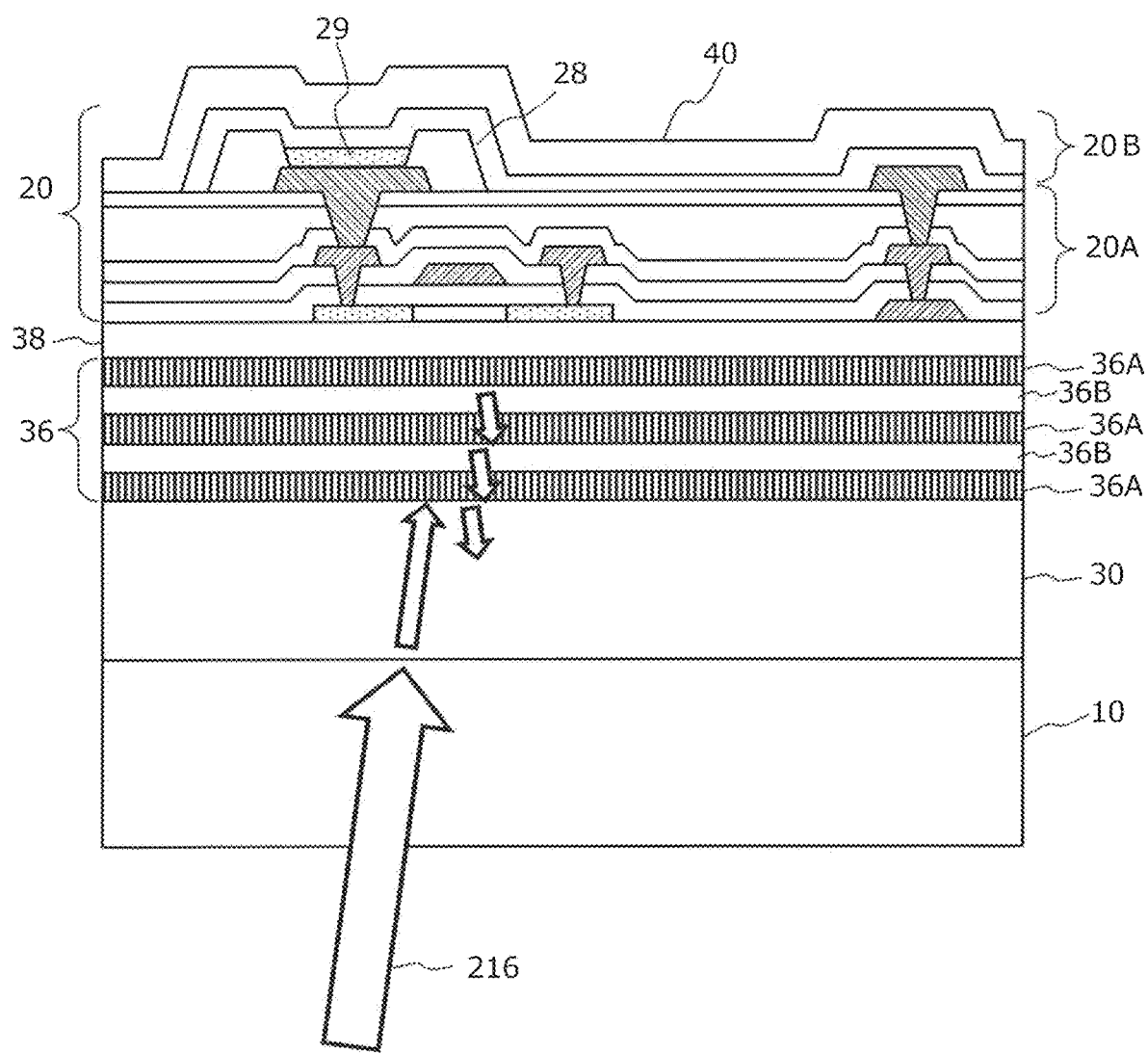
FIG. 7D is a cross-sectional view schematically showing reflection of lift-off light by a dielectric multilayer film mirror in an embodiment of the present disclosure.

FIG. 7D schematically shows entry of the lift-off light 216 into the plastic film 30. In this drawing, for the sake of understandability, the lift-off light 216 diagonally enters the plastic film 30. Typically, the lift-off light 216 perpendicularly enters the plastic film 30.

FIG. 7D schematically shows that part of the lift-off light 216 transmitted through the plastic film 30 is reflected by the dielectric multilayer film mirror 36.

<Simulation of Reflection of Lift-Off Light>

For the layer configurations which have materials, refractive indices, and thicknesses shown in TABLE 1, TABLE 2, TABLE 3 and TABLE A below, the reflectance of the lift-off light at the wavelength of 303 nm was calculated. In the configurations of TABLE 1, TABLE 2, TABLE 3 and TABLE 4, the reflectances were 79%, 56%, 60% and 60%, respectively.

TABLE 1

| Layer Configuration | | Material | Refractive index | Thickness (nm) |
|---|---|---|---|---|
| TFT SEMICONDUCTOR LAYER | | Si | 4 or more | 40 |
| Barrier layer | | $SiN_x$ | 1.94 | 400 |
| Dielectric multilayer film | High refractive index layer | $Ta_2O_5$ | 2.2 | 35 |
| | Low refractive index layer | $MgF_2$ | 1.38 | 55.8 |
| | High refractive index layer | $Ta_2O_5$ | 2.2 | 35 |

TABLE 1-continued

| Layer Configuration | | Material | Refractive index | Thickness (nm) |
|---|---|---|---|---|
| | Low refractive index layer | $MgF_2$ | 1.38 | 55.8 |
| | High refractive index layer | $Ta_2O_5$ | 2.2 | 35 |
| Resin layer | | Polyimide | 1.72 | 10000 |

TABLE 2

| Layer Configuration | | Material | Refractive index | Thickness (nm) |
|---|---|---|---|---|
| TFT SEMICONDUCTOR LAYER | | Si | 4 or more | 40 |
| Barrier layer | | $SiN_x$ | 1.94 | 0 |
| Dielectric multilayer film | High refractive index layer | $SiN_x$ | 1.94 | 39.7 |
| | Low refractive index layer | $SiO_2$ | 1.46 | 52.7 |
| | High refractive index layer | $SiN_x$ | 1.94 | 39.7 |
| | Low refractive index layer | $SiO_2$ | 1.46 | 52.7 |
| | High refractive index layer | $SiN_x$ | 1.94 | 39.7 |
| Resin layer | | Polyimide | 1.72 | 10000 |

TABLE 3

| Layer Configuration | | Material | Refractive index | Thickness (nm) |
|---|---|---|---|---|
| TFT SEMICONDUCTOR LAYER | | Si | 4 or more | 40 |
| Barrier layer | | $SiN_x$ | 1.94 | 400 |
| Dielectric multilayer film | High refractive index layer | $HfO_2$ | 2.0 | 38.5 |
| | Low refractive index layer | $SiO_2$ | 1.46 | 52.7 |
| | High refractive index layer | $HfO_2$ | 2.0 | 38.5 |
| | Low refractive index layer | $SiO_2$ | 1.46 | 52.7 |
| | High refractive index layer | $HfO_2$ | 2.0 | 38.5 |
| Resin layer | | Polyimide | 1.72 | 10000 |

TABLE 4

| Layer Configuration | | Material | Refractive index | Thickness (nm) |
|---|---|---|---|---|
| TFT SEMICONDUCTOR LAYER | | Si | 4 or more | 40 |
| Barrier layer | | $SiN_x$ | 1.94 | 400 |
| Dielectric multilayer film | High refractive index layer | $Y_2O_3$ | 1.9 | 40.5 |
| | Low refractive index layer | $AlF_3$ | 1.35 | 57 |
| | High refractive index layer | $Y_2O_3$ | 1.9 | 40.5 |
| | Low refractive index layer | $AlF_3$ | 1.35 | 57 |
| | High refractive index layer | $Y_2O_3$ | 1.9 | 40.5 |
| Resin layer | | Polyimide | 1.72 | 10000 |

In the above examples, repetition of the high refractive index layers and the low refractive index layers occurs with 2.5 periods. As the number of periods increases, the reflectance also increases. For example, in the layer configuration of TABLE 2, when the number of periods of repetition was 4.5 periods, the realized reflectance was 82%. When the number of periods of repetition was 5.5 periods, the realized reflectance was 90%. However, it is not necessary to achieve such a high reflectance. The reflectance only needs 10 to be not less than 30%. If the reflectance is not less than 50%, the effect is sufficiently achieved.

As previously described, after the semiconductor layer 21 for the TFT layer 20A is deposited, in an embodiment of the present disclosure, the semiconductor layer 21 is irradiated with laser light for reformation such that the crystallinity of the semiconductor layer 21 is improved. This laser light impinges on the semiconductor layer 21 in a direction shown in FIG. 3B. The laser light for polycrystallization of the semiconductor layer 21 enters the dielectric multilayer film mirror 36 after passing through the semiconductor layer 21 although, as shown in FIG. 7C and FIG. 7D, the lift-off light 216 enters the dielectric multilayer film mirror 36 after passing through the base 10 and the plastic film 30. The wavelength of the laser light for semiconductor reformation does not need to be equal to the wavelength of the lift-off light but can be selected from a wavelength band suitable for polycrystallization of the semiconductor layer 21. As a laser irradiation apparatus for polycrystallization of a layer of a semiconductor such as silicon, an excimer laser device which is capable of emitting laser light at the wavelength of 308 nm has been broadly used.

In an embodiment of the present disclosure, the present inventor considered that the wavelength of the lift-off light is different from the wavelength of the laser light used for reformation of the semiconductor layer and studied that the presence of the dielectric multilayer film mirror 36 reduces the influence on the reformation of the semiconductor layer while it effectively realizes reflection of the lift-off light. This is because, if the degree of reformation of the semiconductor layer 21 is uneven, every one of the TFTs for driving sub-pixels of an organic EL display has different characteristics. In an organic EL display which operates in a current-driven mode, the variation of the characteristics among the TFTs causes luminance unevenness in every pixel and deteriorates the display quality. Therefore, it is desirable to reduce the reflection by the dielectric multilayer film mirror 36 of the laser light (for polycrystallization annealing) coming in the direction of the arrow of FIG. 3B. As a result of the research conducted by the present inventor, the present inventor found that an intended function can be realized by providing the gas barrier film 38 that is formed of an inorganic material between the semiconductor layer 21 and the dielectric multilayer film mirror 36 and adjusting the thickness of the gas barrier film 38 to an appropriate size.

Hereinafter, TABLE 5, TABLE 6, TABLE 7 and TABLE 8 show configuration examples where, at the wavelength of the laser light used for delamination (346 nm or 353 nm), the reflectance is maintained relatively high and, at the wavelength of the laser light used for polycrystallization of the semiconductor layer (308 nm), the reflectance relatively decreases.

According to the configuration example of TABLE 5 below, the thickness of the gas barrier film 38 which is made of $SiN_x$ (refractive index n=1.94) is set to 190 nm, so that the reflectance at the wavelength of 308 nm is 45.2%, and the reflectances at the wavelengths of 343 nm and 355 nm are 76.4% and 85.7%, respectively.

TABLE 5

| Layer Configuration | | Material | Refractive index | Thickness (nm) |
|---|---|---|---|---|
| TFT SEMICONDUCTOR LAYER | | Si | 4 or more | 40 |
| Barrier layer | | $SiN_x$ | 1.94 | 190 |
| Dielectric multilayer film | High refractive index layer | $Ta_2O_5$ | 2.2 | 39.0 |
| | Low refractive index layer | $MgF_2$ | 1.38 | 62.1 |
| | High refractive index layer | $Ta_2O_5$ | 2.2 | 39.0 |
| | Low refractive index layer | $MgF_2$ | 1.38 | 62.1 |
| | High refractive index layer | $TaO_5$ | 2.2 | 39.0 |
| Resin layer | | Polyimide | 1.72 | 10000 |

In the configuration example of TABLE 6 below, the thickness of the gas barrier film 38 which is made of $SiN_x$ (refractive index n=1.94) is set to 181.8 nm, so that the reflectance at the wavelength of 308 nm is 12.4%, and the reflectances at the wavelengths of 343 nm and 355 nm are 60.9% and 63.6%, respectively.

TABLE 6

| Layer Configuration | | Material | Refractive index | Thickness (nm) |
|---|---|---|---|---|
| TFT SEMICONDUCTOR LAYER | | Si | 4 or more | 40 |
| Barrier layer | | $SiN_x$ | 1.94 | 181.8 |
| Dielectric multilayer film | High refractive index layer | $SiN_x$ | 1.94 | 44.2 |
| | Low refractive index layer | $SiO_2$ | 1.46 | 58.7 |
| | High refractive index layer | $SiN_x$ | 1.94 | 44.2 |
| | Low refractive index layer | $SiO_2$ | 1.46 | 58.7 |
| | High refractive index layer | $SiN_x$ | 1.94 | 44.2 |
| Resin layer | | Polyimide | 1.72 | 10000 |

In the configuration example of TABLE 7 below, the thickness of the gas barrier film 38 which is made of $SiN_z$ (refractive index n=1.94) is set to 24 nm, so that the reflectance at the wavelength of 308 nm is 17.1%, and the reflectances at the wavelengths of 343 nm and 355 nm are 60.8% and 78.0%, respectively.

TABLE 7

| Layer Configuration | | Material | Refractive index | Thickness (nm) |
|---|---|---|---|---|
| TFT SEMICONDUCTOR LAYER | | Si | 4 or more | 40 |
| Barrier layer | | $SiN_x$ | 1.94 | 24 |
| Dielectric multilayer film | High refractive index layer | $HfO_2$ | 2.0 | 42.9 |
| | Low refractive index layer | $SiO_2$ | 1.46 | 58.7 |
| | High refractive index layer | $HfO_2$ | 2.0 | 42.9 |
| | Low refractive index layer | $SiO_2$ | 1.46 | 58.7 |
| | High refractive index layer | $HfO_2$ | 2.0 | 42.9 |
| Resin layer | | Polyimide | 1.72 | 10000 |

In the configuration example of TABLE 8 below, the thickness of the gas barrier film 38 which is made of $SiN_x$ (refractive index n=1.94) is set to 190 nm, so that the reflectance at the wavelength of 308 nm is 20.41, and the reflectances at the wavelengths of 343 nm and 355 nm are 53.8% anti 71.5%, respectively.

TABLE 8

| Layer Configuration | | Material | Refractive index | Thickness (nm) |
|---|---|---|---|---|
| TFT SEMICONDUCTOR LAYER | | Si | 4 or more | 40 |
| Barrier layer | | SiN$_x$ | 1.94 | 190 |
| Dielectric multilayer film | High refractive index layer | Y$_2$O$_3$ | 1.9 | 45.1 |
| | Low refractive index layer | AlF$_3$ | 1.35 | 63.5 |
| | High refractive index layer | Y$_2$O$_3$ | 1.9 | 45.1 |
| | Low refractive index layer | AlF$_3$ | 1.35 | 63.5 |
| | High refractive index layer | Y$_2$O$_3$ | 1.9 | 45.1 |
| Resin layer | | Polyimide | 1.72 | 10000 |

As described above, by adjusting the configuration of the dielectric multilayer film mirror 36 and the optical thickness of the gas barrier film 38, the reflectance of the dielectric multilayer film mirror 36 can be relatively low at the wavelength of the laser light for reformation of the semiconductor layer (second wavelength) rather than at the wavelength of the lift-off light (first wavelength).

The high refractive index layers included in the dielectric multilayer film, mirror 36 are usually made of a dense material and produce a barrier effect against a gas, such as water vapor. Thus, if the total thickness of the high refractive index layers included in the dielectric multilayer film mirror 36 is not less than 100 nm, improvement in moisture resistance of the flexible OLED device can be expected. Since the dielectric multilayer film mirror 36 can perform not only the optical function but also the function of improving the moisture resistance, when the gas barrier film 38 is provided between the dielectric multilayer film mirror 36 and the functional layer region 20, the thickness of the gas barrier film 38 can be not more than 200 nm.

<Details of Lift-Off Light Irradiation>

Hereinafter, lift-off light irradiation according to the present embodiment is described in detail.

In the present embodiment, the delaminating apparatus includes a line beam source for emitting the lift-off light 216. The line beam source includes a laser device and an optical system for shaping laser light emitted from the laser device into a line beam.

Figure 8A:
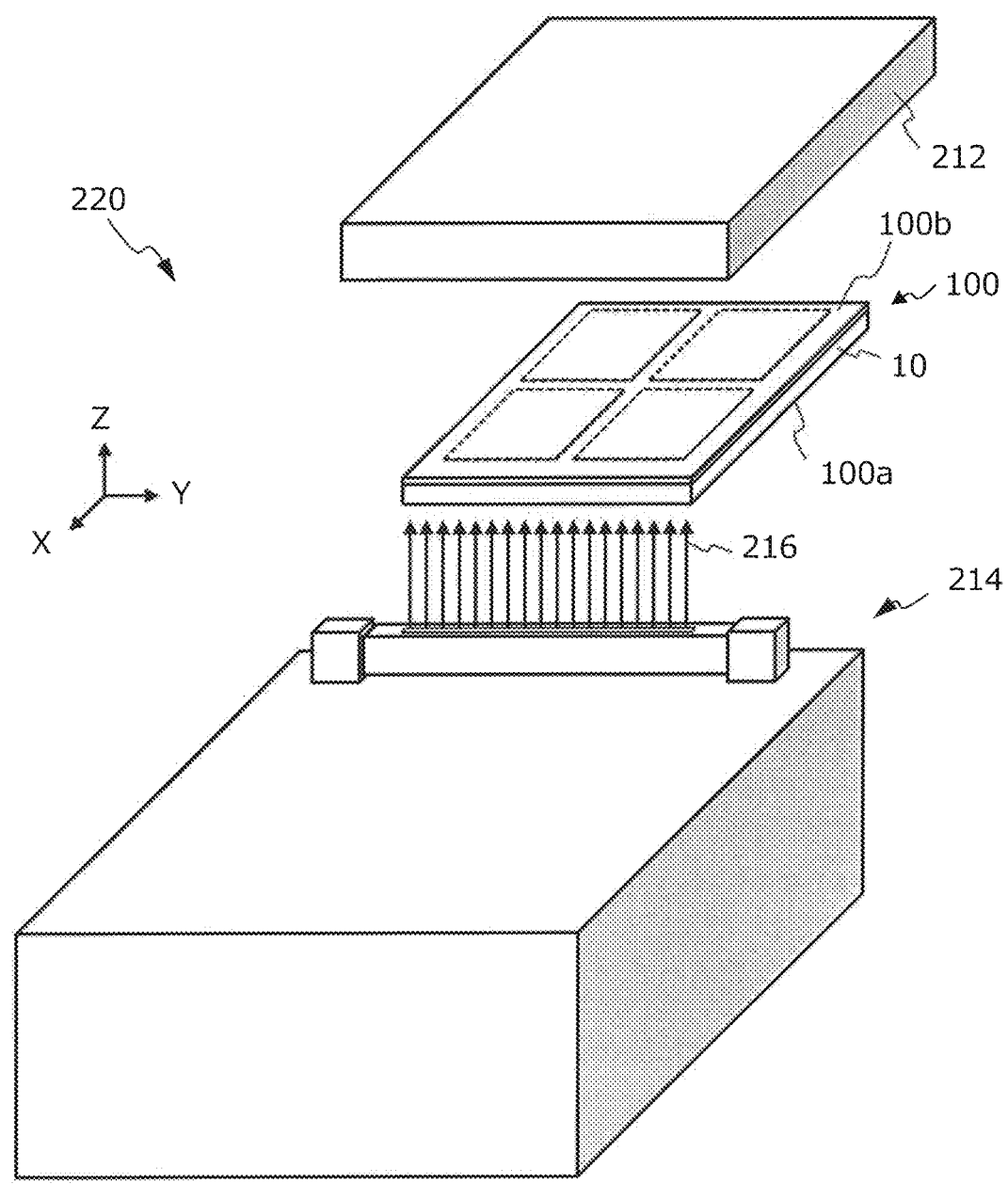
FIG. 8A is a perspective view schematically showing irradiation of the multilayer stack with a line beam emitted from a line beam source of a delaminating apparatus.

FIG. 8A is a perspective view schematically showing irradiation of the multilayer stack 100 with a line beam (lift-off light 216) emitted from a line beam source 214 of a delaminating apparatus 220. For the sake of understandability, the stage 212, the multilayer stack 100 and the line beam source 214 are shown as being spaced away from one another in the Z-axis direction of the drawing. During irradiation with the lift-off light 216, the second surface 100*b* of the multilayer stack 100 is in contact with the stage 212.

Figure 8B:
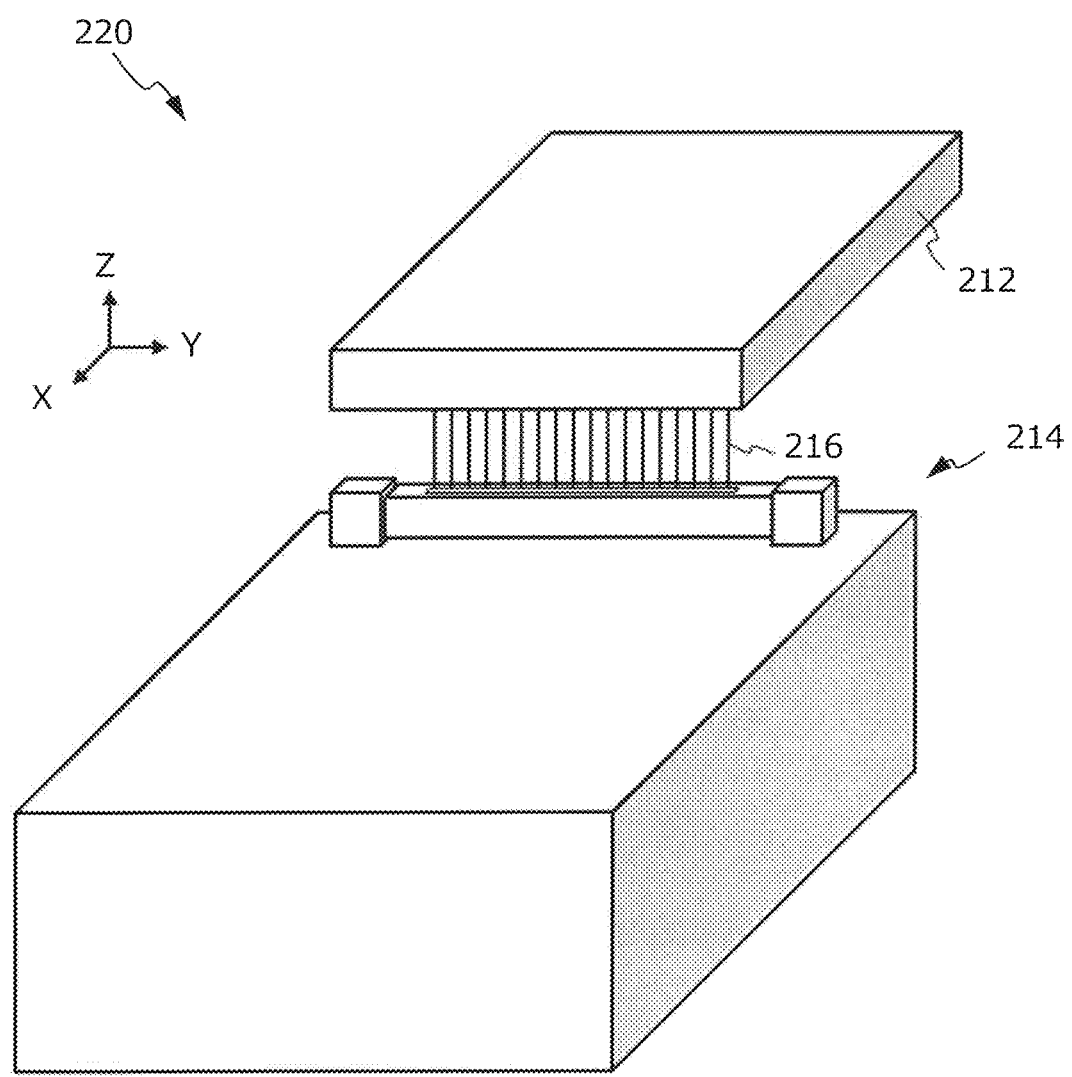
FIG. 8B is a diagram schematically showing the position of the stage at the start of irradiation with lift-off light.

FIG. 8B schematically shows the position of the stage 212 during irradiation with the lift-off light 216. Although not shown in FIG. 8B, the multilayer stack 100 is supported by the stage 212.

Examples of the laser device that emits the lift-off light 216 include gas laser devices such as excimer laser, solid laser devices such as YAG laser, semiconductor laser devices, and other types of laser devices. A XeCl excimer laser device can generate laser light at the wavelength of 308 nm. When yttrium orthovanadate (YVO$_4$) doped with neodymium (Nd) or YVO$_4$ doped with ytterbium (Yb) is used as a lasing medium, the wavelength of laser light (fundamental wave) emitted from the lasing medium is about 1000 nm. Therefore, the fundamental wave can be converted by a wavelength converter to laser light at the wavelength of 340-360 nm (third harmonic wave) before it is used.

From the viewpoint of suppressing generation of ashes, using laser light at the wavelength of 308 nm from the excimer laser device, rather than laser light at the wavelength of 340-360 nm, is more effective. Further, providing the release layer brings about a profound effect in suppressing generation of ashes.

The irradiation with the lift-off light 216 can be carried out with the power density (irradiance) of, for example, 50-400 mJ/cm$^2$. The lift-off light 216 in the shape of a line beam has a size which can extend across the base 10, i.e., a line length which exceeds the length of one side of the base (long axis dimension, size in Y-axis direction of FIG. 8B). The line length can be, for example, not less than 750 mm. Meanwhile, the line width of the lift-off light 216 (short axis dimension, size in X-axis direction of FIG. 8B) can be, for example, about 0.2 mm. These dimensions represent the size of the irradiation region at the interface between the plastic film 30 and the base 10. The lift-off light 216 can be emitted in the form of a pulsed or continuous wave. Irradiation with the pulsed wave can be carried out at the frequency of, for example, about 200 times per seconds.

Figure 8C:
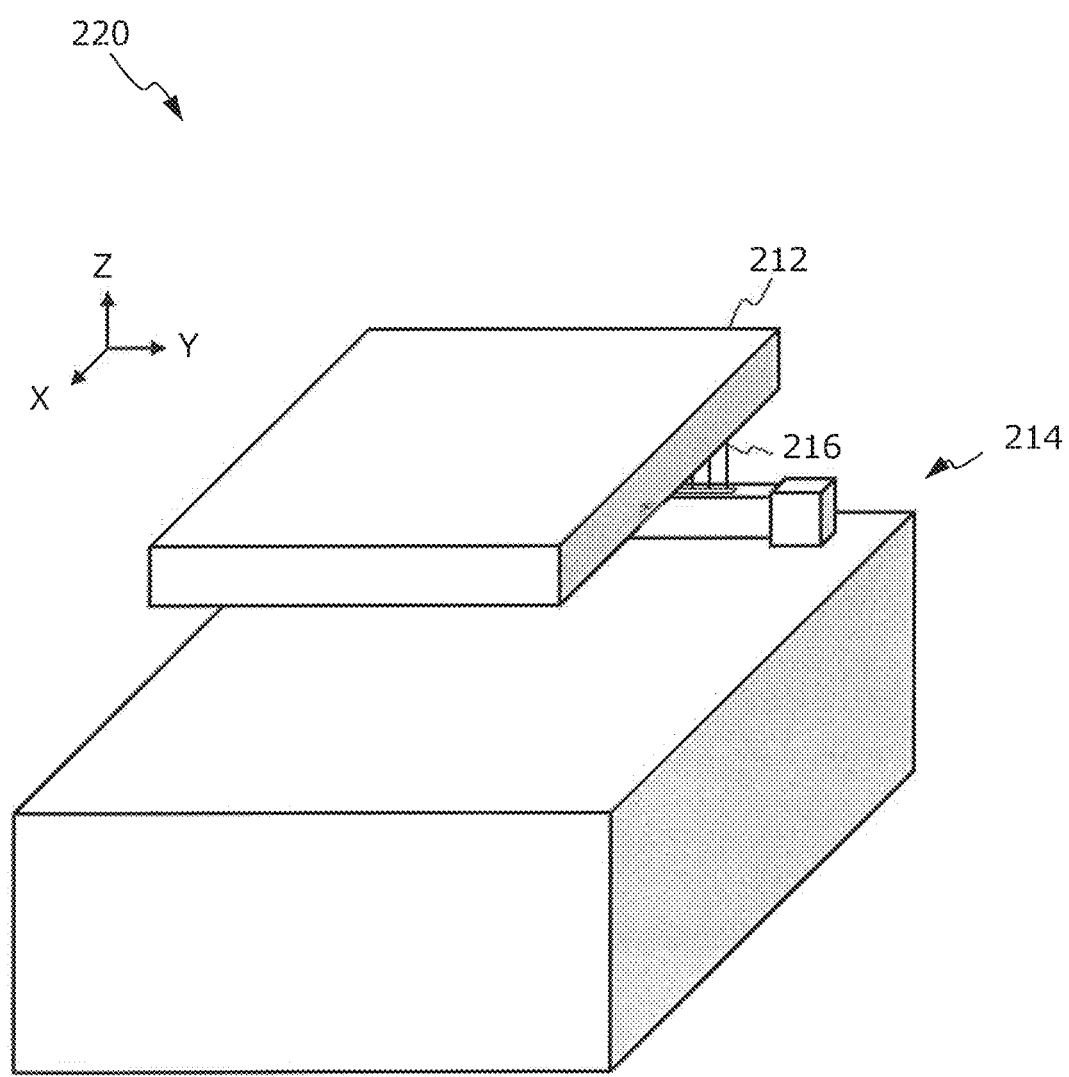
FIG. 8C is a diagram schematically showing the position of the stage at the end of irradiation with lift-off light.

The position of irradiation with the lift-off light 216 moves relative to the base 10 for scanning with the lift-off light 216. In the delaminating apparatus 220, the multilayer stack 100 may be movable while the light source 214 from which the lift-off light is to be emitted and an optical unit (not shown) are stationary, and vice versa. In the present embodiment, irradiation with the lift-off light 216 is carried out during a period where the stage 212 moves from the position shown in FIG. 8B to the position shown in FIG. 8C. That is, scanning with the lift-off light 216 is carried out by movement of the stage 212 in the X-axis direction.

Figure 9A:
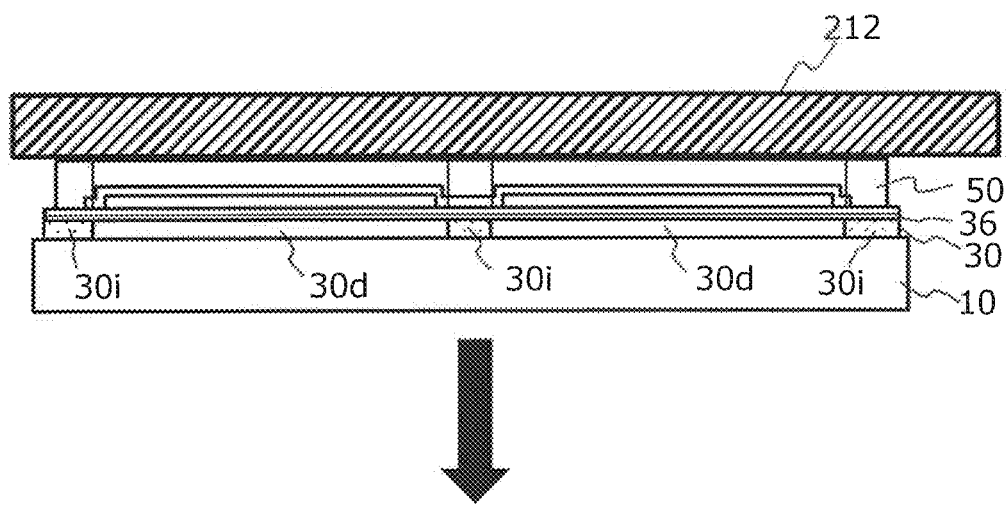
FIG. 9A is a cross-sectional view schematically showing the multilayer stack before the multilayer stack is separated into the first portion and the second portion after irradiation with lift-off light.

FIG. 9A illustrates a state where the multilayer stack 100 is in contact, with the stage 212 after irradiation with the lift-off light. While this state is maintained, the distance from the stage 212 to the base 10 is increased. At this point m time, the stage 212 of the present embodiment holds an OLED device portion of the multilayer stack 100 by suction.

An unshown actuator holds the base 10 and moves the entirety of the base 10 in the direction of the arrow, thereby carrying out delaminating (lift-off). The base 10 can be moved together with an unshown chuck stage while being adhered by suction to the chuck stage. The direction of movement of the base 10 does not need to be vertical, but may be diagonal, to the first surface 100*a* of the multilayer stack 100. The movement of the base 10 does not need to be linear but may be rotational. Alternatively, the stage 212 may be moved upward in the drawing while the base 10 is secured by an unshown holder or another stage.

Figure 9B:
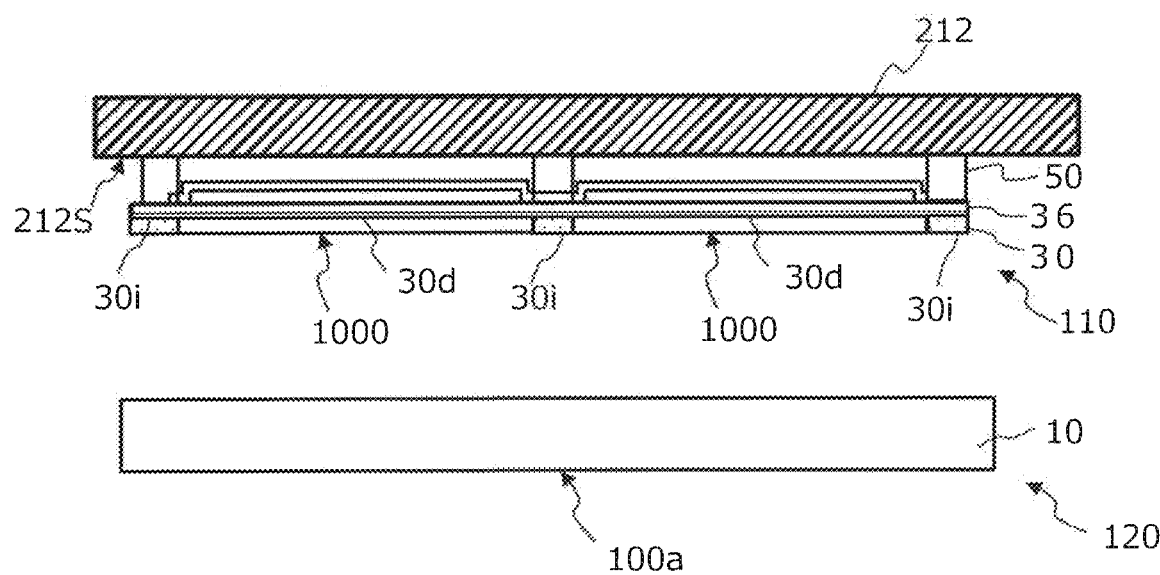
FIG. 9B is a cross-sectional view schematically showing the multilayer stack separated into the first portion and the second portion.

FIG. 9B is a cross-sectional view showing the thus-separated first portion 110 and second portion 120 of the multilayer stack 100. The first: portion 110 of the multilayer stack 100 includes a plurality of OLED devices 1000 which are in contact with the stage 212. The respective OLED devices 1000 include the functional layer regions 20 and the plurality of flexible substrate regions 30*d* of the plastic film 30. Meanwhile, the second portion 120 of the multilayer stack 100 is the base 10.

Respective ones of the OLED devices 1000 supported by the stage 212 are cut off from one another and therefore can be simultaneously or sequentially separated from the stage 212 in an easy manner.

Although in the above-described embodiment respective ones of the OLED devices 1000 are cut away before the LLO step, respective ones of the OLED devices 1000 may be cut away after the LLO step. Cutting away respective ones of the OLED devices 1000 may include dividing the base 10 into corresponding portions.

Figure 10:
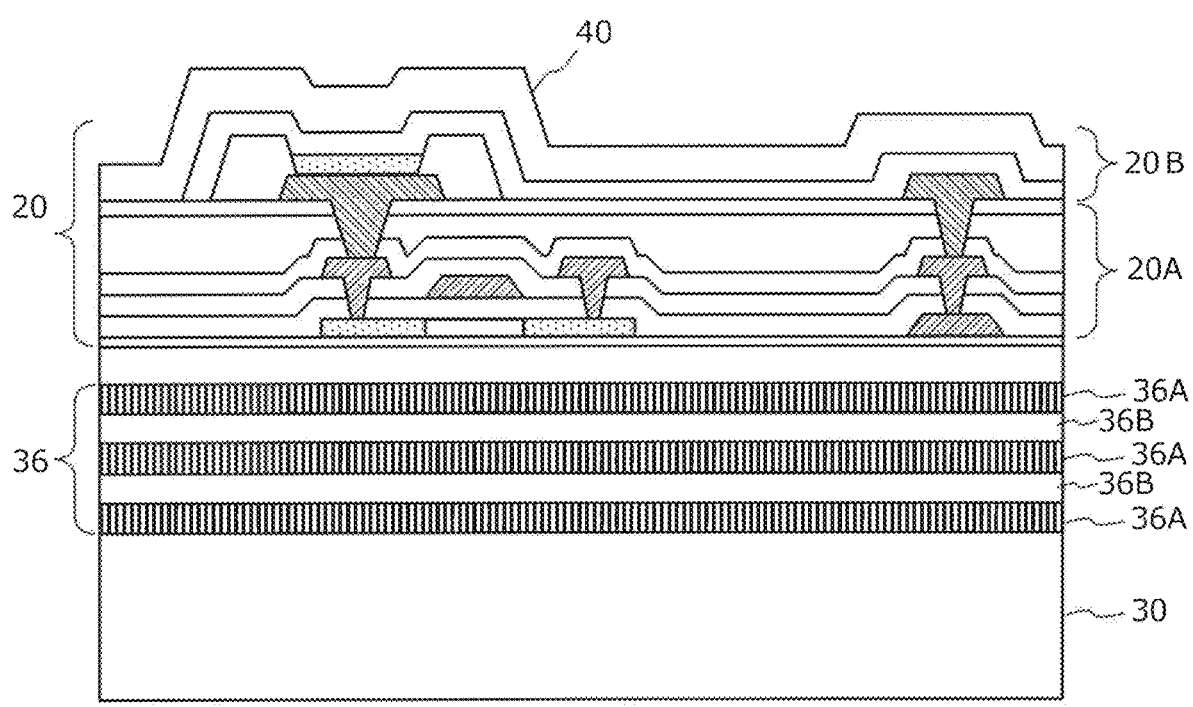
FIG. 10 is a cross-sectional view showing a flexible OLED device of an embodiment of the present disclosure.

FIG. 10 is a cross-sectional view showing a flexible OLED device of an embodiment of the present disclosure. The functional layer region 20 is supported by the flexible substrate region 30d of the plastic film 30 delaminated from the base 10.

According to an embodiment of the present disclosure, even when the flexible film used is made of a polyimide of high transparency which is capable of transmitting ultraviolet light and PET, or when the flexible film used has low transparency but is thin (thickness: 5-20 μm) so that it is capable of transmitting ultraviolet light, deterioration by ultraviolet light in characteristics of the functional layer region and deterioration by ultraviolet light in performance of the gas barrier film can be suppressed.

INDUSTRIAL APPLICABILITY

An embodiment of the present invention provides a novel flexible OLED device production method. A flexible OLED device is broadly applicable to smartphones, tablet computers, on-board displays, and small-, medium- and large-sized television sets.

REFERENCE SIGNS LIST

10 . . . base, 20 . . . functional layer region, 20A . . . TFT layer, 20B . . . OLED layer, 30 . . . plastic film, 30d . . . flexible substrate region of plastic film, 30i . . . intermediate region of plastic film, 40 . . . gas barrier film, 50 . . . protection sheet, 100 . . . multilayer stack, 212 . . . stage, 1000 . . . OLED device

The invention claimed is:

1. A method for producing a flexible OLED device, comprising:
providing a multilayer stack, the multilayer stack including a base, a functional layer region which includes a TFT layer and an OLED layer, a flexible film provided between the base and the functional layer region and supporting the functional layer region, and a dielectric multilayer film mirror provided between the flexible film and the functional layer region; and
irradiating the flexible film with ultraviolet laser light transmitted through the base, thereby delaminating the flexible film from the base,
wherein providing the multilayer stack includes
forming the dielectric multilayer film mirror on the flexible film,
forming a gas barrier film on the dielectric multilayer film mirror,
forming a semiconductor layer on the gas barrier film, and
irradiating the semiconductor layer with laser light which has a second wavelength, thereby reforming the semiconductor layer, the second wavelength being different from a first wavelength of the ultraviolet laser light, and
a reflectance of the dielectric multilayer film mirror is relatively low at the second wavelength rather than at the first wavelength.

2. The method of claim 1, wherein
the ultraviolet laser light which has the first wavelength enters the dielectric multilayer film mirror after passing through the base and the flexible film, and
the laser light which has the second wavelength enters the dielectric multilayer film mirror after passing through the semiconductor layer.

3. The method of claim 1, wherein providing the multilayer stack includes
forming the dielectric multilayer film mirror on the flexible film, including repeating formation of a high refractive index layer which has a first refractive index and formation of a low refractive index layer which has a second refractive index, the second refractive index being lower than the first refractive index.

4. The method of claim 3, wherein a total thickness of the high refractive index layer included in the dielectric multilayer film mirror is not less than 100 nm.

5. The method of claim 4, wherein a thickness of the gas barrier film is not more than 200 nm.

6. The method of claim 3, wherein
the high refractive index layer is made of at least one material selected from the group consisting of $Si_3N_4$, $SiN_x$, $Al_2O_3$, $HfO_2$, $Sc_2O_3$, $Y_2O_3$, $ZrO_2$, $Ta_2O_5$, $TiO_2$ and $Nb_2O_5$, and
the low refractive index layer is made of at least one material selected from the group consisting of $SiO_2$, $MgF_2$, $CaF_2$, $AlF_3$, $YF_3$, $LiF$ and $NaF$.

7. The method of claim 1, wherein a thickness of the flexible film is not less than 5 μm and not more than 20 μm.

* * * * *